United States Patent
Muraki

[11] Patent Number: 5,981,954
[45] Date of Patent: Nov. 9, 1999

[54] ELECTRON BEAM EXPOSURE APPARATUS

[75] Inventor: Masato Muraki, Inagi, Japan

[73] Assignee: Canon Kabushiki Kaisha, Tokyo, Japan

[21] Appl. No.: 09/007,107

[22] Filed: Jan. 14, 1998

[30] Foreign Application Priority Data

Jan. 16, 1997 [JP] Japan ..................................... 9-005440
Jan. 16, 1997 [JP] Japan ..................................... 9-005441

[51] Int. Cl.$^6$ .................................................. H01J 37/304
[52] U.S. Cl. ........................ 250/397; 250/398; 250/492.2
[58] Field of Search .................... 250/397, 398, 250/492.2

[56] References Cited

U.S. PATENT DOCUMENTS

| | | | |
|---|---|---|---|
| 4,608,493 | 8/1986 | Hayafuji .................................. | 250/397 |
| 4,724,328 | 2/1988 | Lischke .................................. | 250/492.2 |
| 4,947,047 | 8/1990 | Muraki .................................. | 250/492.2 |
| 4,982,099 | 1/1991 | Lischke .................................. | 250/398 |
| 5,132,545 | 7/1992 | Shono et al. ........................... | 250/398 |
| 5,345,292 | 9/1994 | Shiozawa et al. ...................... | 355/67 |
| 5,363,170 | 11/1994 | Muraki .................................... | 355/67 |
| 5,382,895 | 1/1995 | Elmer et al. ............................ | 250/397 |
| 5,463,497 | 10/1995 | Muraki et al. .......................... | 359/618 |
| 5,468,966 | 11/1995 | Elmer et al. ............................ | 250/397 |
| 5,554,926 | 9/1996 | Elmer et al. ............................ | 250/397 |
| 5,834,783 | 11/1998 | Muraki et al. .......................... | 250/398 |
| 5,834,786 | 11/1998 | White et al. ............................ | 250/398 |

*Primary Examiner*—Bruce C. Anderson
*Attorney, Agent, or Firm*—Fitzpatrick, Cella, Harper & Scinto

[57] ABSTRACT

An electron beam exposure apparatus, which has an electron source for emitting an electron beam, and an irradiation electron optical system which is arranged between the electron source and a first object, including a portion for transmitting an electron beam, and includes a plurality of electron lenses, and projects the electron beam transmitted through the first object onto a second object to expose it via a reduction electron optical system, acquires information associated with the intensity distribution of the electron beams to be irradiated onto the first object, and adjusts the electron optical characteristics of the irradiation electron optical system on the basis of the acquired information associated with the intensity distribution.

34 Claims, 17 Drawing Sheets

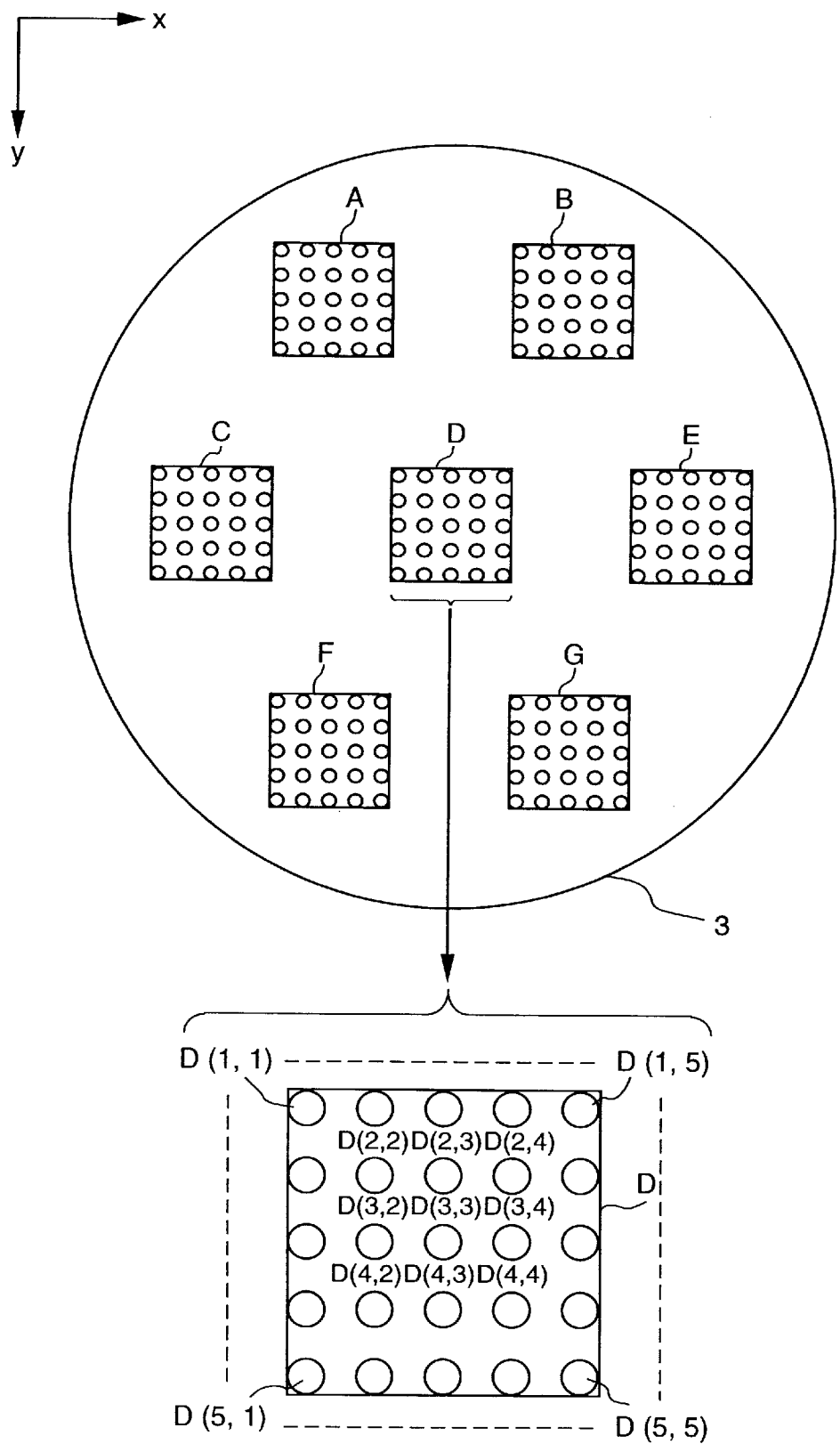

SEMICONDUCTOR DEVICE MANUFACTURING FLOW

ELECTRON BEAM EXPOSURE APPARATUS

BACKGROUND OF THE INVENTION

The present invention relates to an electron beam exposure apparatus and, more particularly, to an electron beam exposure apparatus for irradiating electron beams from an electron source and drawing a pattern on a wafer or on a mask or reticle using the electron beams, its control method, and an electron beam irradiation device suitable for the electron beam exposure apparatus.

An electron beam exposure apparatus includes a point beam type that uses a beam having a spot-like sectional shape, and a variable rectangular beam type that uses a beam having a rectangular sectional shape of a variable size.

The point beam type electron beam exposure apparatus is used for only research and development purposes since it draws using a single electron beam and has a low throughput. The variable rectangular beam type electron beam exposure apparatus has a higher throughput than the point type apparatus by about one to two orders of magnitudes but also suffers many problems of throughput since it basically draws using a single electron beam, when a pattern including fine patterns as small as about 0.1 μm at a high degree of integration is to be exposed.

As an apparatus that can solve such problems, a stencil mask type electron beam exposure apparatus is known. In this apparatus, the pattern to be drawn is formed as a pattern through holes on a stencil mask, and is transferred onto a reticle surface via a reduction electron optical system by illuminating the stencil mask with an electron beam. Also, a multi electron beam type exposure apparatus is known. In this apparatus, a substrate having a plurality of apertures is illuminated with an electron beam, a plurality of electron beams coming from the plurality of apertures are irradiated onto a reticle surface and are deflected to scan the reticle surface, and these electron beams are individually turned on/off in correspondence with the pattern to be drawn, thereby drawing a pattern. Both the apparatuses can improve the throughput since the area to be exposed, i.e., the exposure area is broader than the conventional apparatuses.

However, in the stencil mask type electron beam exposure apparatus, if the electron beam that illuminates the stencil mask is nonuniform, the transferred pattern is distorted. On the other hand, in the multi electron beam type exposure apparatus, if the plurality of electron beams have intensity variations, again the drawn pattern is distorted.

SUMMARY OF THE INVENTION

It is an object of the present invention to minimize any nonuniformity of the electron beam intensity distribution.

In order to achieve the above object, an electron beam irradiation device according to the present invention, which has an electron source for emitting an electron beam and an irradiation electron optical system arranged between said electron source and an object to be irradiated with an electron beam and including a plurality of electron lenses, comprises acquisition means for acquiring information associated with an intensity distribution of an electron beam to be irradiated onto the object to be irradiated and adjustment means for adjusting electron optical characteristics of said irradiation electron optical system on the basis of the acquired information associated with the intensity distribution.

In the above device, said adjustment means comprises means for adjusting electron optical powers of at least two of the plurality of electron lenses of said irradiation electron optical system.

In the above device, said adjustment means comprises means for adjusting positions of at least two of the plurality of electron lenses of said irradiation electron optical system in an optical axis direction of said irradiation electron optical system.

In the above device, said adjustment means adjusts the electron optical characteristics of said irradiation electron optical system to obtain a substantially constant intensity distribution of the electron beam irradiated onto the object to be irradiated.

In order to achieve the above object, an electron beam exposure apparatus according to the present invention, which has an electron source for emitting an electron beam and an irradiation electron optical system which is arranged between said electron source and a first object, including a portion for transmitting an electron beam, and includes a plurality of electron lenses, and projects the electron beam transmitted through the first object onto a second object to expose it via a reduction electron optical system, comprises: acquisition means for acquiring information associated with an intensity distribution of an electron beam to be irradiated onto the first object; and adjustment means for adjusting electron optical characteristics of said irradiation electron optical system on the basis of the acquired information associated with the intensity distribution.

In order to achieve the above object, a control method of an electron beam irradiation device according to the present invention provides a method of controlling an electron beam irradiation device having an electron source for emitting an electron beam and an irradiation electron optical system arranged between said electron source and an object to be irradiated with an electron beam and including a plurality of electron lenses, comprising the acquisition step of acquiring information associated with an intensity distribution of an electron beam to be irradiated onto the object to be irradiated; and the adjustment step of adjusting electron optical characteristics of said irradiation electron optical system on the basis of the acquired information associated with the intensity distribution.

It is another object of the present invention to suppress distortion of the pattern to be drawn on an object to be exposed such as a wafer, mask, reticle, or the like by eliminating nonuniformity of the irradiation amount of an electron beam.

In order to achieve the above object, an electron beam exposure apparatus according to one embodiment of the present invention provides an the apparatus wherein said adjustment means comprises means for adjusting electron optical powers of at least two of a plurality of electron lenses of an irradiation electron optical system. In the apparatus, said adjustment means comprises means for adjusting positions of at least two of the plurality of electron lenses of said irradiation electron optical system in an optical axis direction of said irradiation electron optical system. In the above apparatus, said adjustment means adjusts the electron optical characteristics of said irradiation electron optical system to obtain a substantially constant intensity distribution of the electron beam irradiated onto the first object.

In the above apparatus, the first object has a plurality of apertures and means for controlling, in units of apertures, whether or not electron beams transmitted through the apertures are shielded.

In the above apparatus, the first object has electron optical systems for forming intermediate images of said electron source in correspondence with the apertures.

In the above apparatus, it is preferable that the apparatus further comprises correction means for individually controlling said electron optical systems arranged in correspondence with the apertures to correct aberration produced when the intermediate images are projected onto the second object via said reduction optical system.

In the above apparatus, the first object is a mask formed with a pattern defined by portions that transmit and portions which do not transmit the electron beams.

In order to achieve the above object, a control method of an electron beam exposure apparatus according to one embodiment of the present invention provides a method of controlling an electron beam exposure apparatus, which has an electron source for emitting an electron beam and an irradiation electron optical system which is arranged between said electron source and a first object, including a portion for transmitting an electron beam, and includes a plurality of electron lenses, and projects the electron beam transmitted through the first object onto a second object to expose it via a reduction electron optical system, comprising: the acquisition step of acquiring information associated with an intensity distribution of an electron beam to be irradiated onto the first object; and the adjustment step of adjusting electron optical characteristics of said irradiation electron optical system on the basis of the acquired information associated with the intensity distribution.

In order to achieve the above object, an electron beam exposure apparatus according to another embodiment of the present invention provides an electron beam exposure apparatus having an electron source for emitting an electron beam, and exposing an object to be exposed using the electron beam emitted by said electron source, comprising: a substrate disposed between said electron source and a table for placing the object to be exposed, said substrate having a plurality of apertures, which have areas that make amounts of electron beams transmitted through the apertures substantially coincide with each other; a plurality of elementary electron optical systems for forming intermediate images of said electron source by the electron beams transmitted through the plurality of apertures of said substrate; and a reduction electron optical system for projecting the plurality of intermediate images formed by said plurality of elementary electron optical systems onto the object to be exposed.

In the above apparatus, it is preferable that the apparatus further comprises acquisition means for acquiring information associated with an intensity distribution of the electron beam irradiated onto said substrate, and wherein the areas of the apertures of said substrate are determined on the basis of the acquired intensity distribution.

In the above apparatus, it is preferable that the apparatus further comprises acquisition means for acquiring information associated with an intensity distribution of the electron beam irradiated onto said substrate; and exchanging means for exchanging said substrate, disposed between said electron source and the table for placing the object to be exposed by a substrate having apertures with optimal areas, on the basis of the acquired intensity distribution.

In the above apparatus, said substrate is exchangeable, and said apparatus further comprises: acquisition means for acquiring information associated with an intensity distribution of the electron beam irradiated onto said substrate; determination means for determining a substrate having apertures with optimal areas on the basis of the acquired information associated with the intensity distribution; and output means for outputting information for specifying the determined substrate.

In the above apparatus, it is preferable that the apparatus further comprises an irradiation electron optical system arranged between said electron source and said substrate and including a plurality of electron lenses; acquisition means for acquiring information associated with an intensity distribution of the electron beam irradiated onto said substrate; and adjustment means for adjusting electron optical characteristics of said irradiation electron optical system on the basis of the acquired information associated with the intensity distribution.

In the above apparatus, said adjustment means comprises means for adjusting electron optical powers of at least two of the plurality of electron lenses of said irradiation electron optical system.

In the above apparatus, said adjustment means comprises means for adjusting positions of at least two of the plurality of electron lenses of said irradiation electron optical system in an optical axis direction of said irradiation electron optical system.

In the above apparatus, said adjustment means adjusts the electron optical characteristics of said irradiation electron optical system to obtain a substantially constant intensity distribution of the electron beam irradiated onto said substrate.

In the above apparatus, it is preferable that the apparatus further comprises correction means for correcting aberration produced when the intermediate images formed by said plurality of elementary electron optical systems are projected onto the object to be exposed via said reduction electron optical system.

In the above apparatus, it is preferable that the apparatus further comprises means for controlling, in units of apertures, whether or not the electron beams transmitted through the plurality of apertures of said substrate are shielded.

In order to achieve the above object, a control method of an electron beam exposure apparatus according to another embodiment of the present invention provides a method of controlling an electron beam exposure apparatus, which comprises an electron source for emitting an electron beam, a substrate disposed between said electron source and a table for placing the object to be exposed, and having a plurality of apertures, a plurality of elementary electron optical systems for forming intermediate images of said electron source by the electron beams transmitted through the plurality of apertures of said substrate, and a reduction electron optical system for projecting the plurality of intermediate images formed by said plurality of elementary electron optical systems onto the object to be exposed, comprising: the acquisition step of acquiring information associated with an intensity distribution of the electron beam irradiated onto said substrate; and the determination step of determining areas of the apertures that can make amounts of electron beams transmitted through the plurality of apertures of said substrate substantially coincide with each other.

The electron beam exposure apparatus is suitable for manufacturing devices.

Further objects, features and advantages of the present invention will become apparent from the following detailed description of embodiments of the present invention with reference to the accompanying drawings.

BRIEF DESCRIPTION OF THE DRAWINGS

FIG. 3 is a view for explaining an elementary electron optical system array 3;

DETAILED DESCRIPTION OF THE PREFERRED EMBODIMENTS

First Embodiment

Explanation of Constituting Elements of Electron Beam Exposure Apparatus

Figure 1:
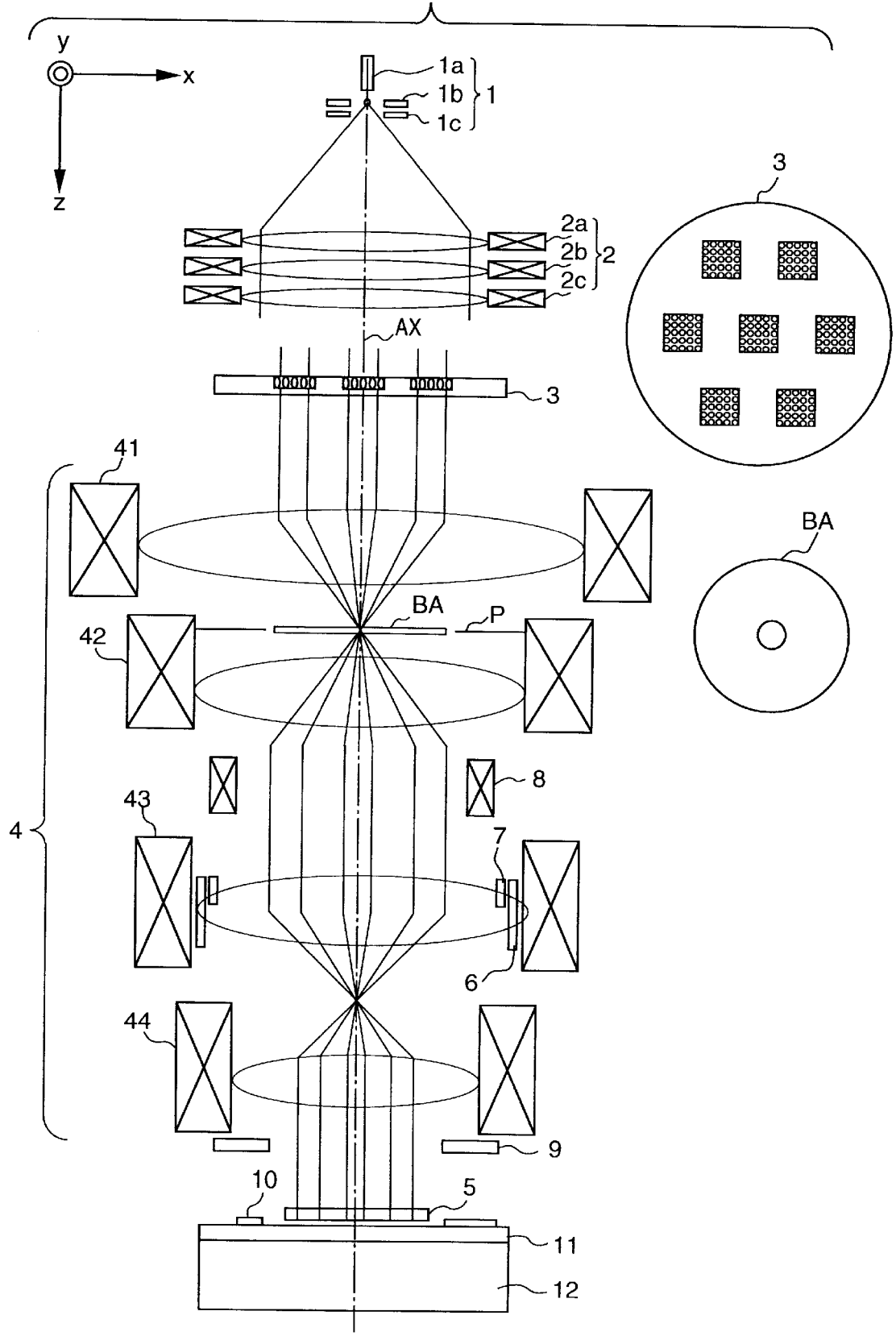
FIG. 1 is a schematic view showing a principal part of an electron beam exposure apparatus according to the first embodiment of the present invention.

FIG. 1 is a schematic view showing a principal part of an electron beam exposure apparatus according to the first embodiment of the present invention.

Referring to FIG. 1, reference numeral 1 denotes an electron gun made up of a cathode 1a, grid 1b, and anode 1c. Electrons emitted by the cathode 1a form a crossover image between the grid 1b and anode 1c. This crossover image will be referred to as an electron source hereinafter.

Electrons coming from this electron source are converted into nearly collimated electron beams by a condenser lens 2 (irradiation electron lens optical system) whose front-side focal point position is located at the electron source position. The nearly collimated electron beams are irradiated onto an elementary electron optical system array 3. The condenser lens 2 is made up of electron lenses 2a, 2b, and 2c. The intensity distribution of the electron beams irradiated onto the elementary electron optical system can be adjusted by adjusting the electron optical powers (focal lengths) of at least two of the electron lenses 2a, 2b, and 2c, adjusting the positions of at least two of the electron lenses 2a, 2b, and 2c in the optical axis direction of the condenser lens 2, or adjusting both of them. This adjustment function will be explained below with reference to FIGS. 2A and 2B.

When the intensity of the incoming electron beam from the electron source is uniform per unit solid angle, i.e., when the output light distribution of the electron source is uniform, and when f is the focal length of the condenser lens 2, and x is the incident position of an electron beam, which leaves the electron source making an angle θ with an optical axis AX, on the elementary electron optical system 3, if the condenser lens 2 has electron optical characteristics that satisfy:

$$x = f \times \theta \tag{1}$$

the intensity distribution of the electron beams irradiated onto the elementary electron optical system 3 also becomes uniform. Conversely, by adjusting the electron optical characteristics of the condenser lens 2, the intensity distribution of electron beams irradiated onto the elementary electron optical system can be changed.

Figure 2A:
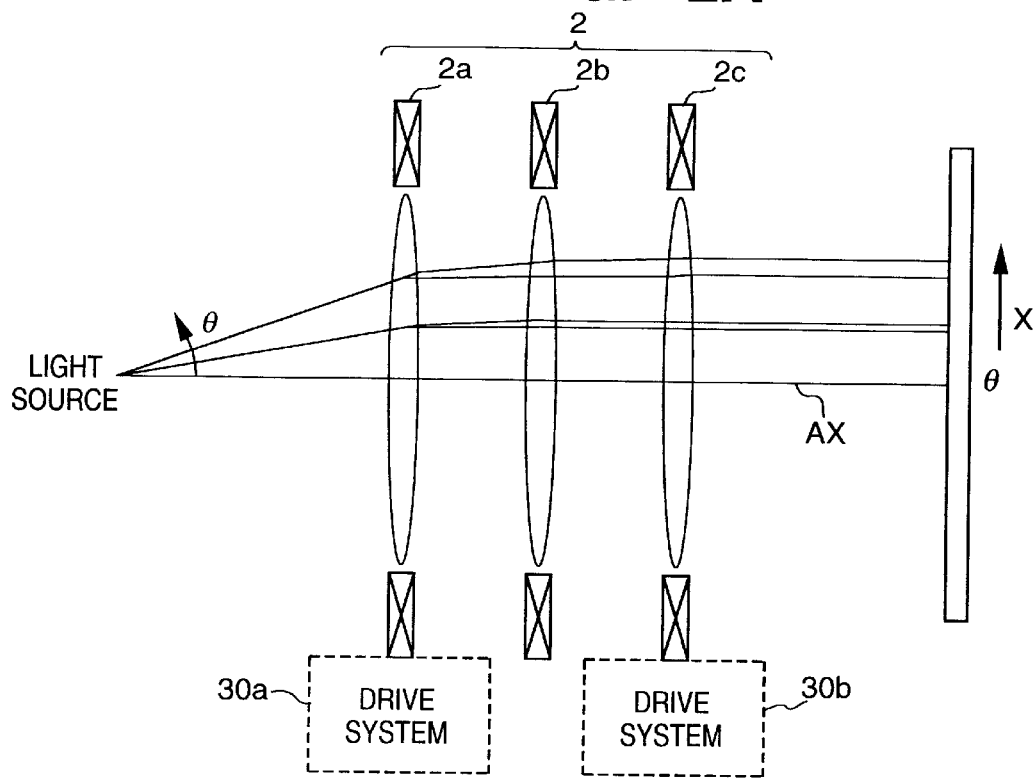
FIGS. 2A and 2B are views for explaining the intensity distribution adjustment function of a condenser lens.
Figure 2B:
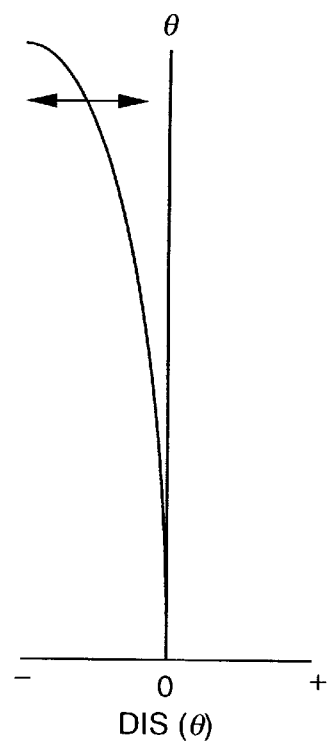

An ideal position x(θ) represents the incident position of the electron beam, which leaves the electron source at the angle θ with the optical axis AX, on the elementary electron optical system 3 that satisfies equation (1), x1(θ) represents the actual incident position of the electron beam on the elementary electron optical system 3 via the condenser lens 2, and the ratio of the difference between these positions to the ideal position is given by DIS(θ)=[x(θ)−x1(θ)]/x(θ). In this case, DIS(θ) is one electron optical characteristic of the condenser lens 2, and can be expressed, as shown in FIG. 2B. DIS(θ) can be changed, as indicated by an arrow in FIG. 2B, by adjusting the electron optical powers of at least two of the electron lenses 2a, 2b, and 2c, adjusting the positions of at least two of the electron lenses 2a, 2b, and 2c in the direction of the optical axis Ax of the irradiation electron lens optical system, or adjusting both of them. More specifically, the excitation currents of at least two electron lenses are adjusted, or adjustment is done by drive systems 30a and 30b for moving the electron lenses in the optical axis direction, as shown in FIG. 2A.

For example, the electron optical characteristics of the condenser lens 2 are adjusted so that DIS(θ) tends to the minus direction as the exit angle θ becomes larger. In this case, as compared to the characteristics before adjustment, in the intensity distribution of the electron beams irradiated onto the elementary electron optical system 3, the intensity of the electron beams increases with increasing distance from the optical axis AX.

Note that the electron optical characteristics (DIS(θ)) of the condenser lens 2 are adjusted so that the entire system of the condenser lens 2 has a nearly uniform electron optical power, and the front-side focal point position of the condenser lens 2 becomes substantially constant.

Referring back to FIG. 1, the elementary electron optical system array 3 is formed by arranging a plurality of elementary electron optical systems each consisting of a blanking electrode, aperture, and electron lens in a direction perpendicular to the optical axis AX. The elementary electron optical system 3 will be explained in detail later.

The elementary electron optical system array 3 forms a plurality of intermediate images of the electron source. These intermediate images are projected in a reduced scale by a reduction electron optical system 4 (to be described later), and form a plurality of images on a wafer 5.

In this case, the individual elements of the elementary electron optical system array 3 are set so that the interval between adjacent images formed on the wafer 5 equals an integer multiple of the size of each image. Furthermore, the elementary electron optical system array 3 makes the positions of the individual intermediate images differ in the optical axis direction in correspondence with the curvature of field of the reduction electron optical system 4, and corrects in advance any aberrations expected to be produced when the individual intermediate images are projected in a reduced scale by the reduction electron optical system 4.

The reduction electron optical system 4 comprises a symmetric magnetic tablet consisting of a first projection lens 41 (43) and second projection lens 42 (44). If f1 represents the focal length of the first projection lens 41 (43), and f2 represents the focal length of the second projection lens 42 (44), the distance between these two lenses is f1+f2. The object point on the optical axis AX is located at the focal point position of the first projection lens 41 (43), and its image point is formed at the focal point of the second projection lens 42 (44). This image is reduced to –f2/f1. Since two lens magnetic fields are determined to act in opposite directions, Seidel aberrations and chromatic aberrations associated with rotation and magnification theoretically cancel each other, except for five aberrations, i.e., spherical aberration, isotropic astigmatism, isotropic coma, curvature of field, and on-axis chromatic aberration.

Reference numeral 6 denotes a deflector for deflecting a plurality of electron beams coming from the elementary electron optical system array 3 to displace a plurality of electron source images by nearly equal displacement amounts in the X- and Y-directions on the wafer 5. The deflector 6 comprises a main deflector used when the deflection width is large, and a sub deflector used when the deflection width is small (neither are shown). The main deflector is an electromagnetic type deflector, and the sub deflector is an electrostatic type deflector.

Reference numeral 7 denotes a dynamic focus coil that corrects any deviations of the focus positions of the electron source images arising from deflection aberration produced upon operation of the deflector 6; and 8, a dynamic stigmatic coil that corrects astigmatism of deflection aberration produced upon deflection as in the dynamic focus coil 7.

Reference numeral 9 denotes a reflected electron detector for detecting reflected electrons or secondary electrons produced when the electron beams coming from the elementary electron optical system array 3 land on alignment marks formed on the wafer 5.

Reference numeral 10 denotes a Faraday cup having two single knife edges respectively extending in the X- and Y-directions. The Faraday cup detects the charge amount of images formed by the electron beams coming from the elementary electron optical system.

Reference numeral 11 denotes a θ-Z stage that carries a wafer, and is movable in the direction of the optical axis AX (Z-axis) and in the direction of rotation about the Z-axis. The above-mentioned Faraday cup 10 is fixed on the stage 11.

Reference numeral 12 denotes an X-Y stage which carries the θ-Z stage and is movable in the X- and Y-directions perpendicular to the direction of the optical axis AX (Z-axis).

The elementary electron optical system array 3 will be explained below with reference to FIG. 3.

In the elementary electron optical system array 3, a plurality of elementary electron optical systems form a group (subarray), and a plurality of subarrays are formed. In this embodiment, seven subarrays A to G are formed. In each subarray, a plurality of elementary electron optical systems are two-dimensionally arranged. Twenty-five elementary electron optical systems (e.g., D(1,1) to D(5,5)) are formed in each subarray of this embodiment, and form electron source images, which are aligned at the interval of pitch Pb ($\mu$m) in both the X- and Y-directions, on the wafer via the reduction electron optical system 4.

Figure 4:
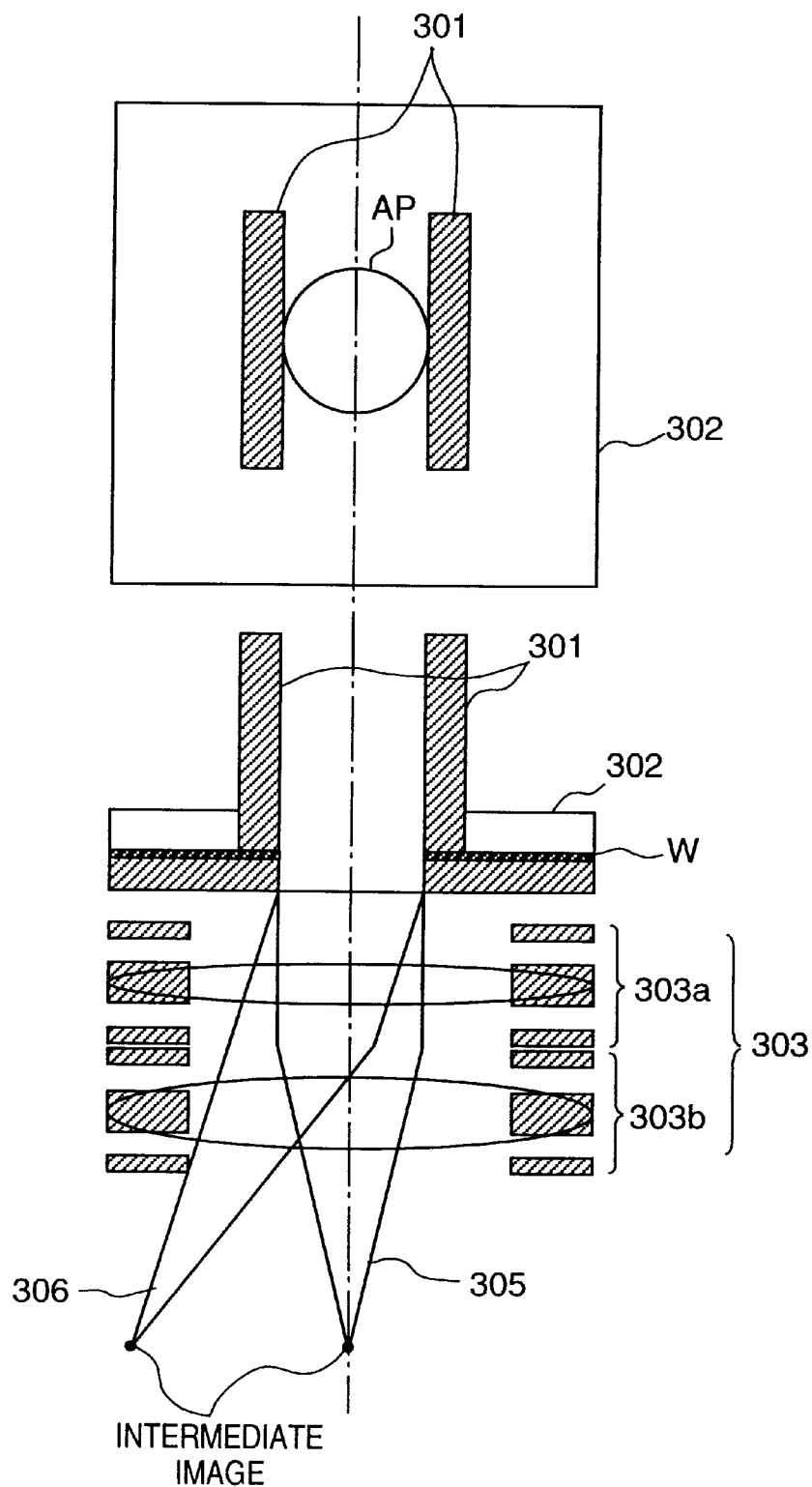
FIG. 4 is a sectional view for explaining an elementary electron optical system.

FIG. 4 is a sectional view of each elementary electron optical system.

Referring to FIG. 4, reference numeral 301 denotes a blanking electrode which is made up of a pair of electrodes and has a deflection function; and 302, a substrate which has an aperture (A) that defines the shape of the electron beam to be transmitted, and is common to other elementary electron optical systems. On the substrate 302, the blanking electrode 303 end a wiring layer (W) for turning on/off the electrodes are formed. Reference numeral 303 denotes an electron lens, which uses two unipotential lenses 303a and 303b. Each unipotential lens is made up of three aperture electrodes, and has a convergence function by setting the upper and lower electrodes at the same potential as an acceleration potential V0, and keeping the intermediate electrode at another potential V1 or V2.

Figure 5A:
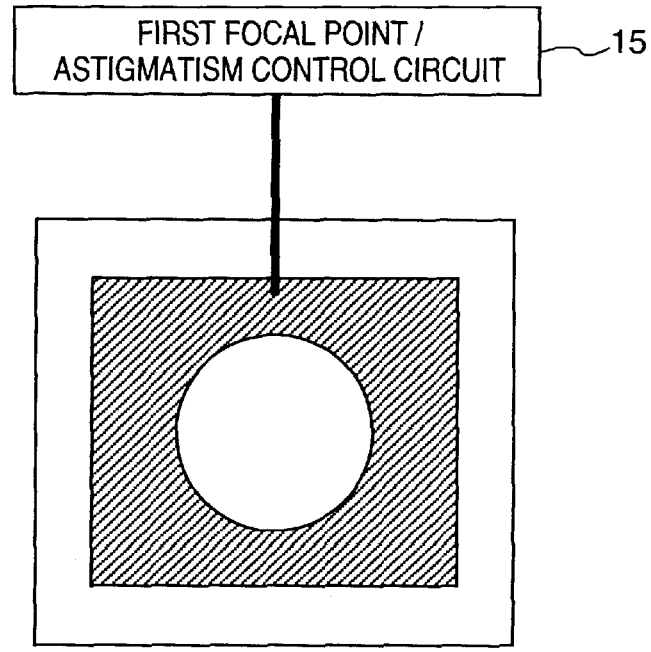
FIGS. 5A and 5B are views for explaining the electrodes of the elementary electron optical system.

The upper, intermediate, and lower electrodes of the unipotential lens 303a and the upper and lower electrodes of the unipotential lens 303b have a shape shown in FIG. 5A, and the upper and lower electrodes of the unipotential lenses 303a and 303b are set at a common potential in all the elementary electron optical systems by a first focal point astigmatism control circuit 15 (to be described later).

Since the potential of the intermediate electrode of the unipotential lens 303a can be set by the first focal point.astigmatism control circuit 15 in units of elementary electron optical systems, the focal length of the unipotential lens 303a can be set in units of elementary electron optical systems.

Figure 5B:
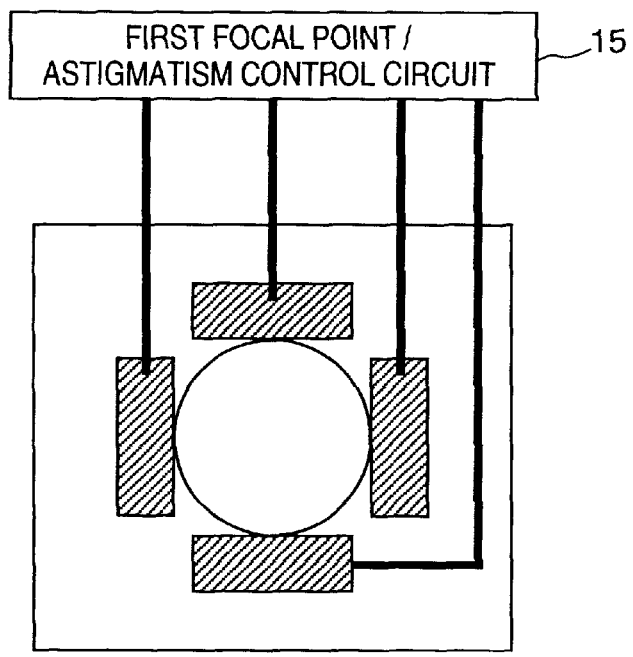

The intermediate electrode of the unipotential lens 303b is made up of four electrodes, as shown in FIG. 5B, and the potentials of these electrodes can be set independently and also individually in units of elementary electron optical systems by the first focal point.astigmatism control circuit 15. Hence, the unipotential lens 303b can have different focal lengths in a section perpendicular to its optical axis and can set them individually in units of elementary electron optical systems.

As a consequence, by respectively controlling the potentials of the intermediate electrodes of the elementary electron optical systems, the electron optical characteristics (the intermediate image forming positions and astigmatism) of the elementary electron optical systems can be controlled.

Each nearly collimated electron beam output from the condenser lens 2 forms an intermediate image of the electron source by the electron lens 303 via the blanking electrode 301 and the aperture (AP). At this time, if no electric field is applied across the electrodes of the blanking electrode 301, the electron beam is not deflected, as indicated by 305 in FIG. 4. On the other hand, if an electric field is applied across the electrodes of the blanking electrode 301, the electron beam is deflected, as indicated by 306 in FIG. 4. Since the electron beams 305 and 306 have different angle distributions on the object plane of the reduction electron optical system 4, they become incident on different regions at the pupil position (on a plane P in FIG. 1) of the reduction electron optical system 4. Hence, a blanking aperture BA that transmits the electron beam 305 alone is formed at the pupil position (on the plane P in FIG. 1) of the reduction electron optical system.

The elementary electron optical systems individually set their two intermediate electrodes so as to correct curvature of field and astigmatism produced when the intermediate images formed thereby are projected in a reduced scale onto the surface to be exposed by the reduction electron optical system 4, thereby making their electron optical characteristics (intermediate image forming positions and astigmatism) different. However, in this embodiment, in order to decrease the number of wiring lines between the intermediate electrodes and the first focal point.astigmatism control circuit 15, the elementary electron optical systems included in a single subarray have identical electron optical characteristics, and the electron optical characteristics (intermediate image forming positions and astigmatism) of the elementary electron optical systems are controlled in units of subarrays.

Furthermore, in order to correct distortion produced when a plurality of intermediate images are projected in a reduced scale onto the surface to be exposed by the reduction electron optical system 4, the distortion characteristics of the reduction electron optical system 4 are detected in advance, and the positions of the elementary electron optical systems in the direction perpendicular to the optical axis of the reduction electron optical system 4 are set based on the detected characteristics.

Figure 6:
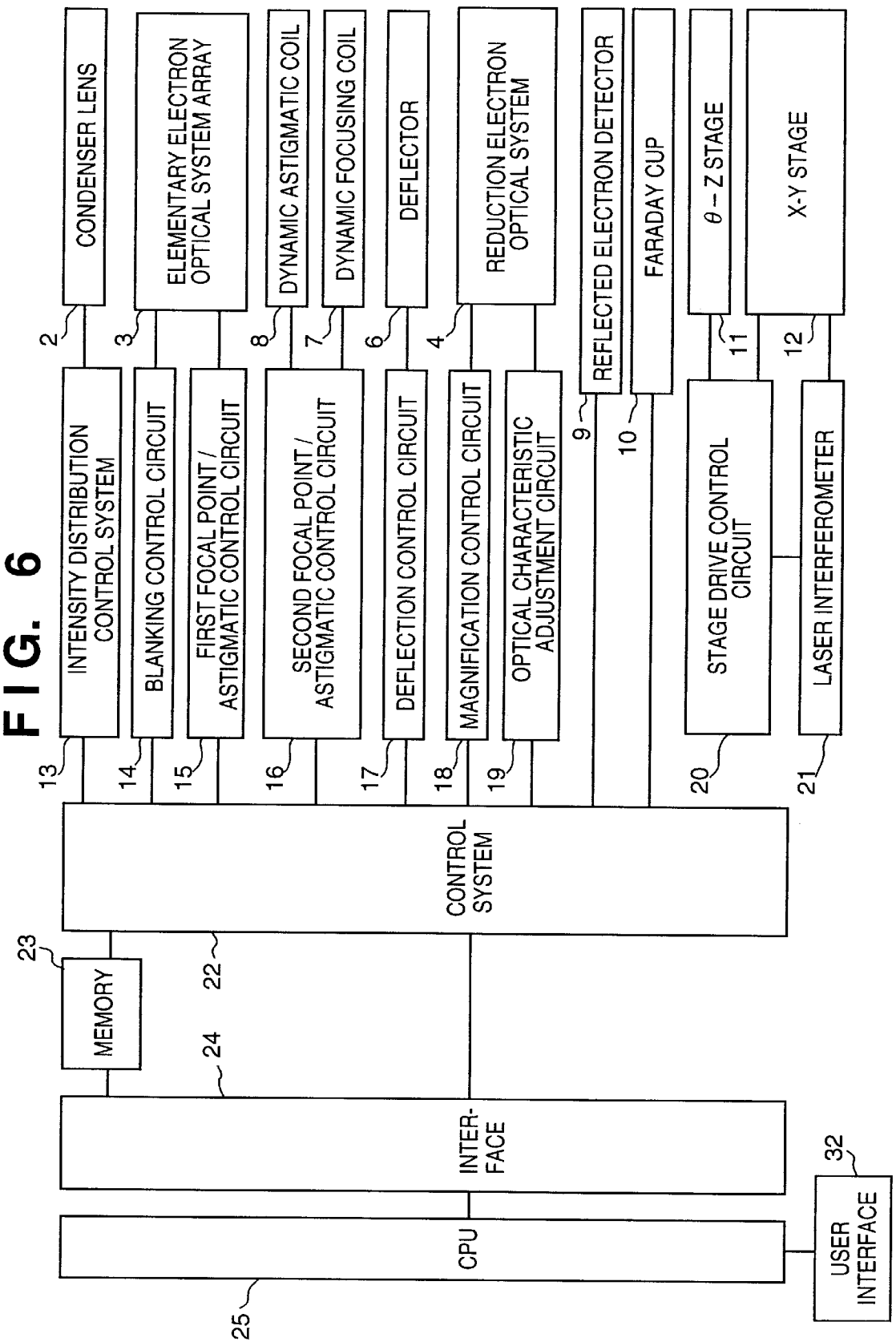
FIG. 6 is a block diagram for explaining the system arrangement according to the present invention.

FIG. 6 shows the system arrangement of this embodiment.

An intensity distribution control system 13 adjusts the electron optical powers (focal lengths) by changing the excitation currents of at least two of the electron lenses 2a, 2b, and 2c that make up the condenser lens 2, adjusts the positions of at least two of the electron lenses 2a, 2b, and 2c in the optical axis direction of the irradiation electron lens system using the drive systems, or adjusts both of them.

A blanking control circuit 14 individually ON/OFF-controls the blanking electrodes of the elementary electron optical systems in the elementary electron optical system array 3, and the first focal point astigmatism control circuit 15 individually controls the electron optical characteristics (intermediate image forming positions and astigmatism) of the elementary electron optical systems in the elementary electron optical system array 3.

A second focal point astigmatism control circuit 16 controls the focal point position and astigmatism of the reduction electron optical system 4 by controlling the dynamic stigmatic coil 8 and dynamic focus coil 7. A deflection control circuit 17 controls the deflector 6. A magnification adjustment circuit 18 adjusts the magnification of the reduction electron optical system 4. An optical characteristic circuit 19 adjusts rotation aberration and optical axis by changing the excitation currents of electromagnetic lenses that make up the reduction electron optical system 4.

A stage drive control circuit 20 controls driving of the θ-Z stage, and also controls driving of the X-Y stage 12 in collaboration with a laser interferometer 21 that detects the position of the X-Y stage 12.

A control system 22 synchronously controls the above-mentioned control circuits, reflected electron detector 9, and Faraday cup 10 to attain exposure and alignment based on data from a memory 23 that stores information associated with the pattern to be drawn. The control system 22 is controlled by a CPU 25 for controlling the entire electron beam exposure apparatus via an interface 24.

Explanation of Operation

The operation of the electron beam exposure apparatus according to this embodiment will be explained below with reference to FIGS. 6 and 12.

This exposure apparatus executes calibration before exposing a wafer. More specifically, the CPU 25 directs the control system 22 to execute calibration via the interface 24. In response to this direction, the control system 22 executes calibration shown in the flow chart in FIG. 12.

In step 1, the control system 22 adjusts the potentials of the intermediate electrodes of the elementary electron optical systems via the first focal point.astigmatism control circuit 15, so as to set the positions of the intermediate images formed by the elementary electron optical systems in the elementary electron optical system array 3 at predetermined positions in the optical axis direction.

In step 2, the control system 22 selects one elementary electron optical system of the elementary electron optical system array 3, and controls the blanking control circuit 14 so that only the electron beam coming from the selected elementary electron optical system is irradiated onto the wafer side. More specifically, the control system 22 directs the blanking control circuit 14 to turn on the blanking electrodes of the elementary electron optical systems other than the selected elementary electron optical system, and to turn off the blanking electrode of the selected elementary electron optical system.

In step 3, the control system 22 directs the stage drive control circuit 20 to drive the X-Y stage 12 so that the Faraday cup 10 is located near the image formed by the electron beam coming from the selected elementary electron optical system. The control system 22 then detects the amount of electron beam coming from the selected elementary electron optical system, i.e., the current, using the Faraday cup 10. The control system 22 stores the detected current value in the memory 23 in correspondence with the selected elementary electron optical system.

In step 4, the control system 22 checks if the currents of all the elementary electron optical systems of the elementary electron optical system array 3 have been detected in step 3. If elementary electron optical systems, the currents of which are to be detected, still remain, the flow returns to step 2. In this case, in step 2, the control system 22 selects an elementary electron optical system from which a current is not detected from the elementary electron optical system array 3. In this manner, upon completion of current detection for all the elementary electron optical systems in steps 2 to 4, the flow then advances to step 5.

In step 5, the control system 22 obtains the intensity distribution of electron beams irradiated from the elementary electron optical system array 3 on the basis of the current values of the respective elementary electron optical systems stored in the memory 23. The control system 22 then commands the intensity distribution control circuit 13 to adjust the condenser lens 2 on the basis of the obtained intensity distribution, so that the intensity distribution of the electron beams irradiated from the elementary electron optical system array 3 becomes uniform. More specifically, the control system 22 directs the intensity distribution control circuit 13 to adjust the electron optical powers of at least two of the electron lenses 2a, 2b, and 2c that make up the condenser lens 2, adjust the positions of at least two of the electron lenses 2a, 2b, and 2c in the optical axis direction of the irradiation electron lens system, or adjust both of them.

In this embodiment, the irradiation currents from all the elementary electron optical systems are measured. In order to shorten the measurement time, the irradiation region on the elementary electron optical system array 3 may be grouped into small regions (e.g., subarrays), and the electron beam intensity distribution may be obtained by detecting only the current based on the electron beam coming from a specific elementary electron optical system in each small region. For example, the small regions are assumed to be sub groups A to G, and only the currents based on the electron beams coming from elementary electron optical systems A(3,3), B(3,3), C(3,3), D(3,3), E(3,3), F(3,3), and G(3,3), which are located at the center of the groups, are detected.

When the CPU 25 directs the control system 22 to "execute exposure" via the interface 24, the control system 22 executes the following steps.

Step 11

The control system 22 directs the deflection control circuit 17 to deflect a plurality of electron beams coming from the elementary electron optical system array using the sub deflector of the deflector 6, and directs the blanking control circuit 14 to turn on/off the blanking electrodes of the elementary electron optical systems in accordance with the pattern to be exposed onto the wafer 5. At this time, the X-Y stage 12 is continuously moving in the X- or Y-direction, and the deflection control circuit 17 controls the deflection positions of the electron beams as well as the moving amount of the X-Y stage 12.

Figure 7:
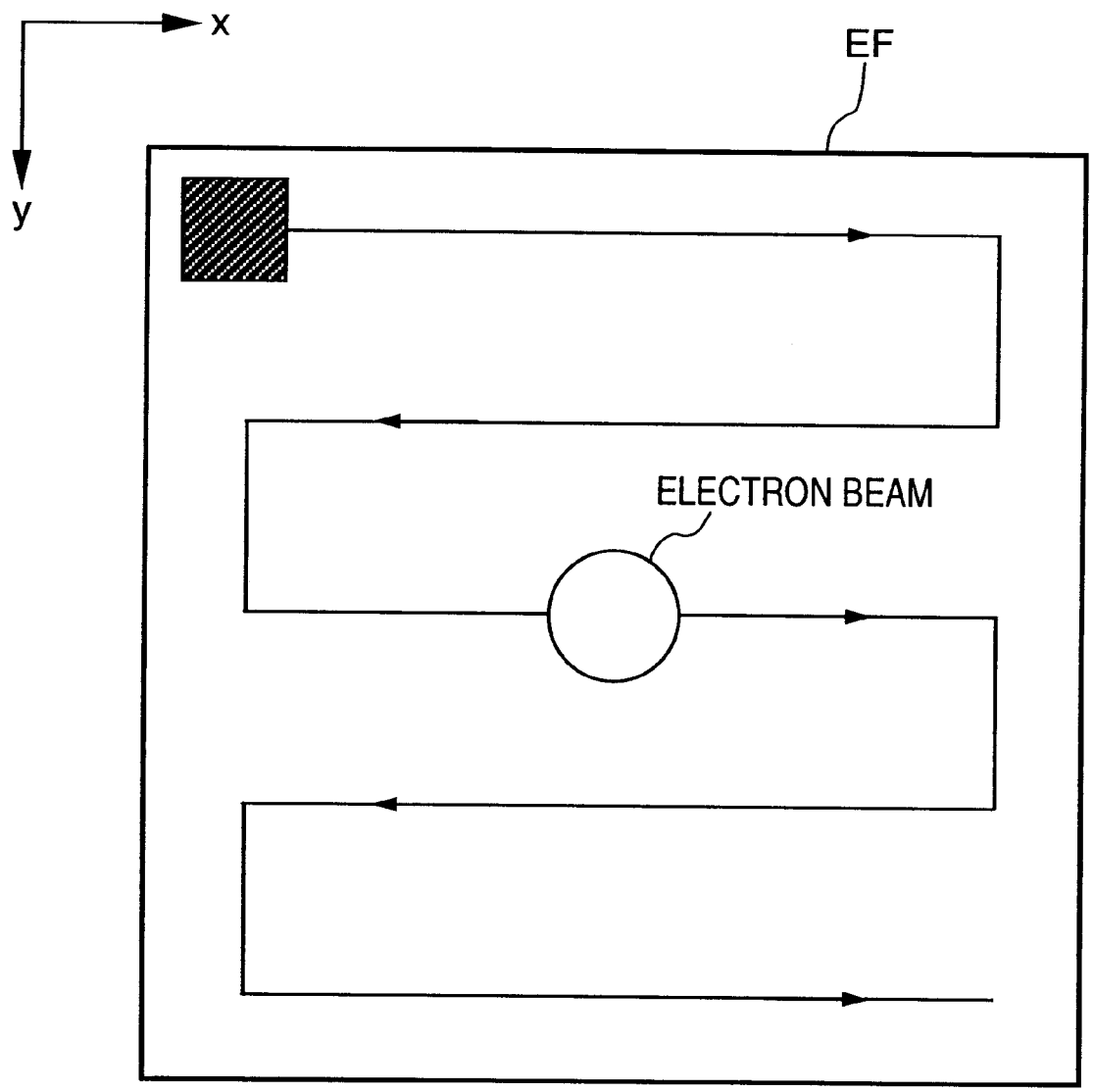
FIG. 7 is a view for explaining an exposure field (EF)
Figure 8:
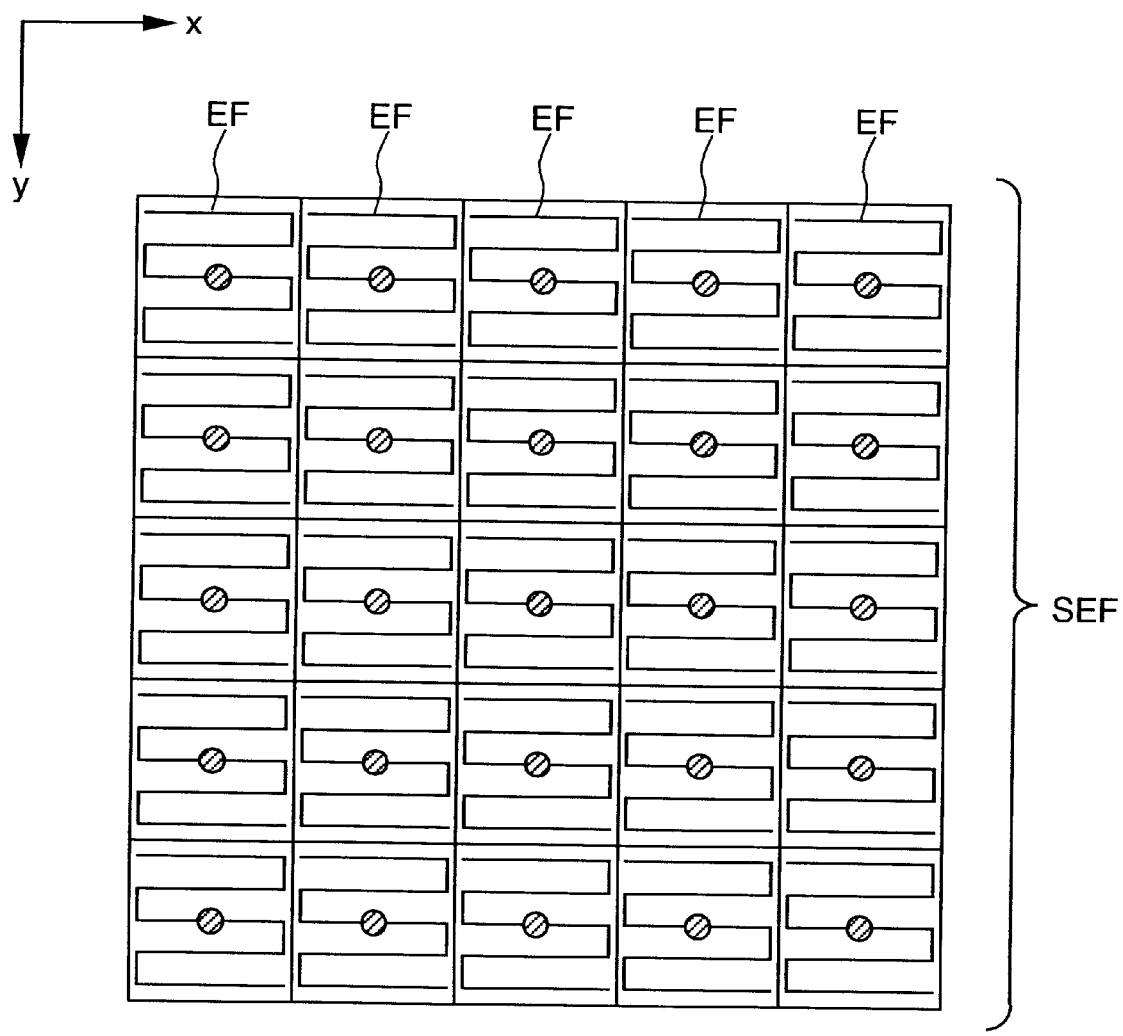
FIG. 8 is a view for explaining a subarray exposure field (SEF)
Figure 9:
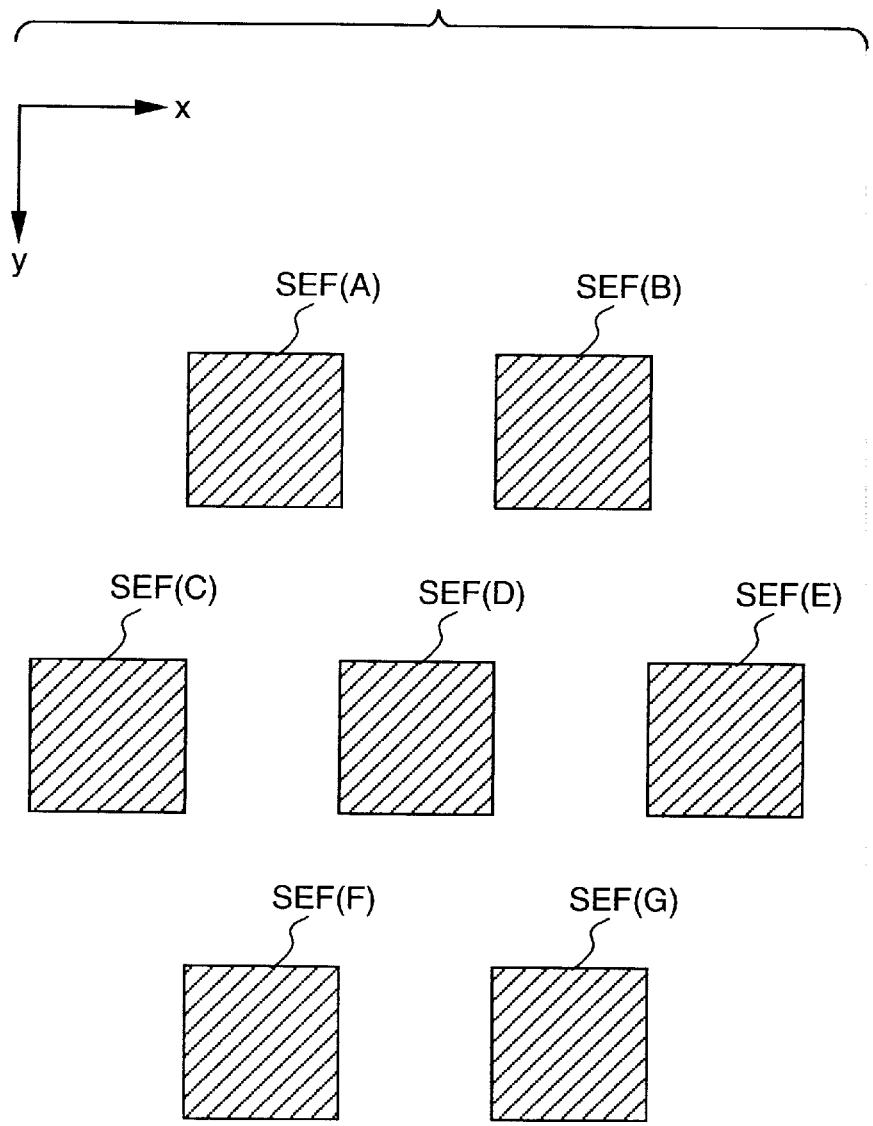
FIG. 9 is a view for explaining a subfield.

As a result, an electron beam from one elementary electron optical system scans and exposes an exposure field (EF) on the wafer 5 to have a black square as the start point, as shown in FIG. 7. Also, as shown in FIG. 8, the exposure fields (EFs) of the plurality of elementary electron optical systems in each subarray are set adjacent to each other, and consequently, a subarray exposure field (SEF) made up of a plurality of exposure fields (EF) is exposed. At the same time, on the wafer 5, a subfield made up of subarray exposure fields (SEFs) respectively formed by the subarrays A to G as shown in FIG. 9 is exposed.

Step 12

Figure 10:
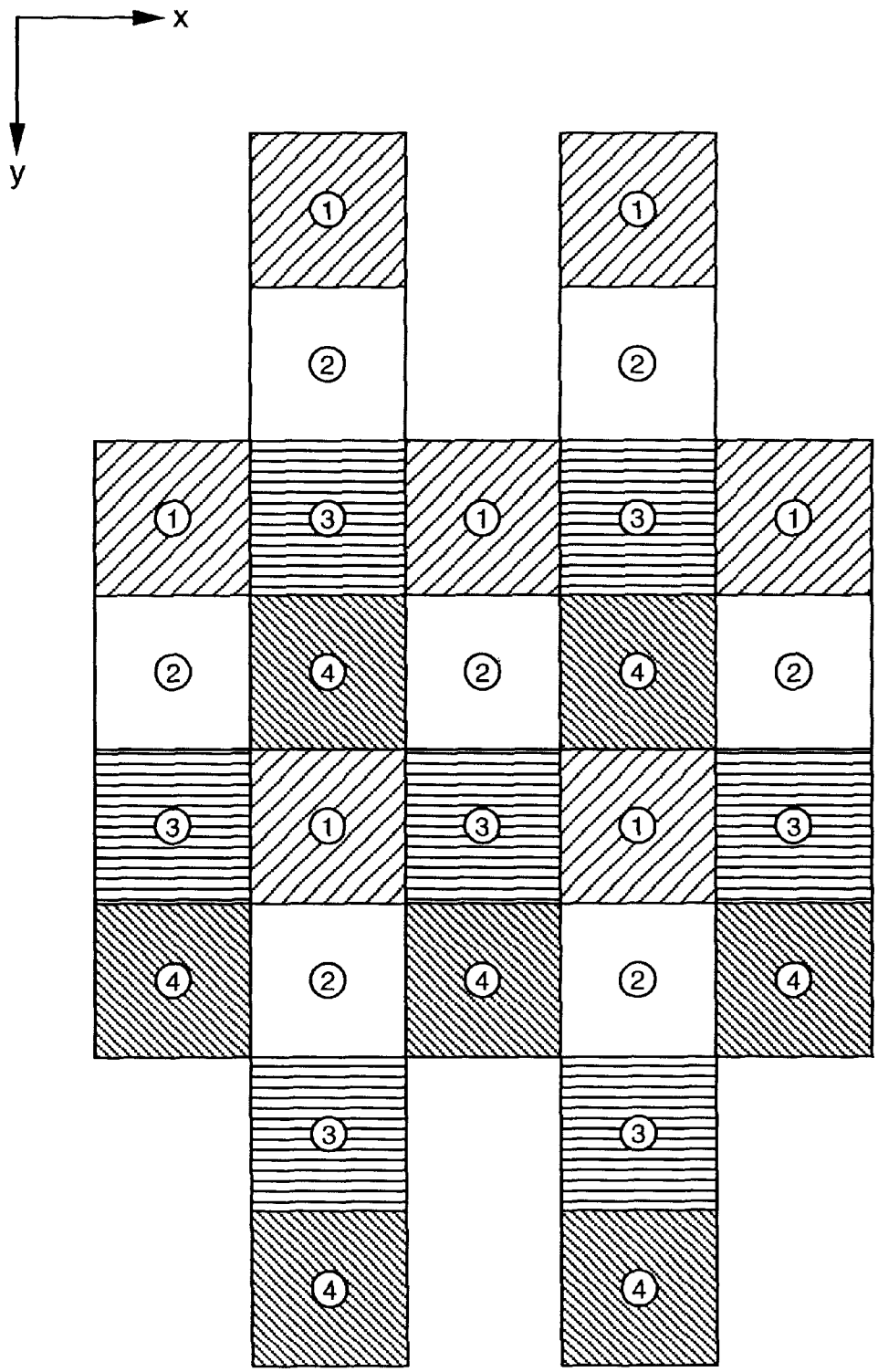
FIG. 10 is a view for explaining wafer scanning exposure.

The control system 22 directs the deflection control circuit 17 to deflect a plurality of electron beams coming from the elementary electron optical system array using the main deflector of the deflector 6 so as to expose subfield 2 after exposure of subfield 1 shown in FIG. 10. Henceforth, the control system 22 performs operation in step 11 to expose subfield 3.

By repeating steps 11 and 12 above, the entire surface of the wafer is exposed by sequentially exposing subfields like subfields 3 and 4, as shown in FIG. 10.

Second Embodiment

Figure 11:
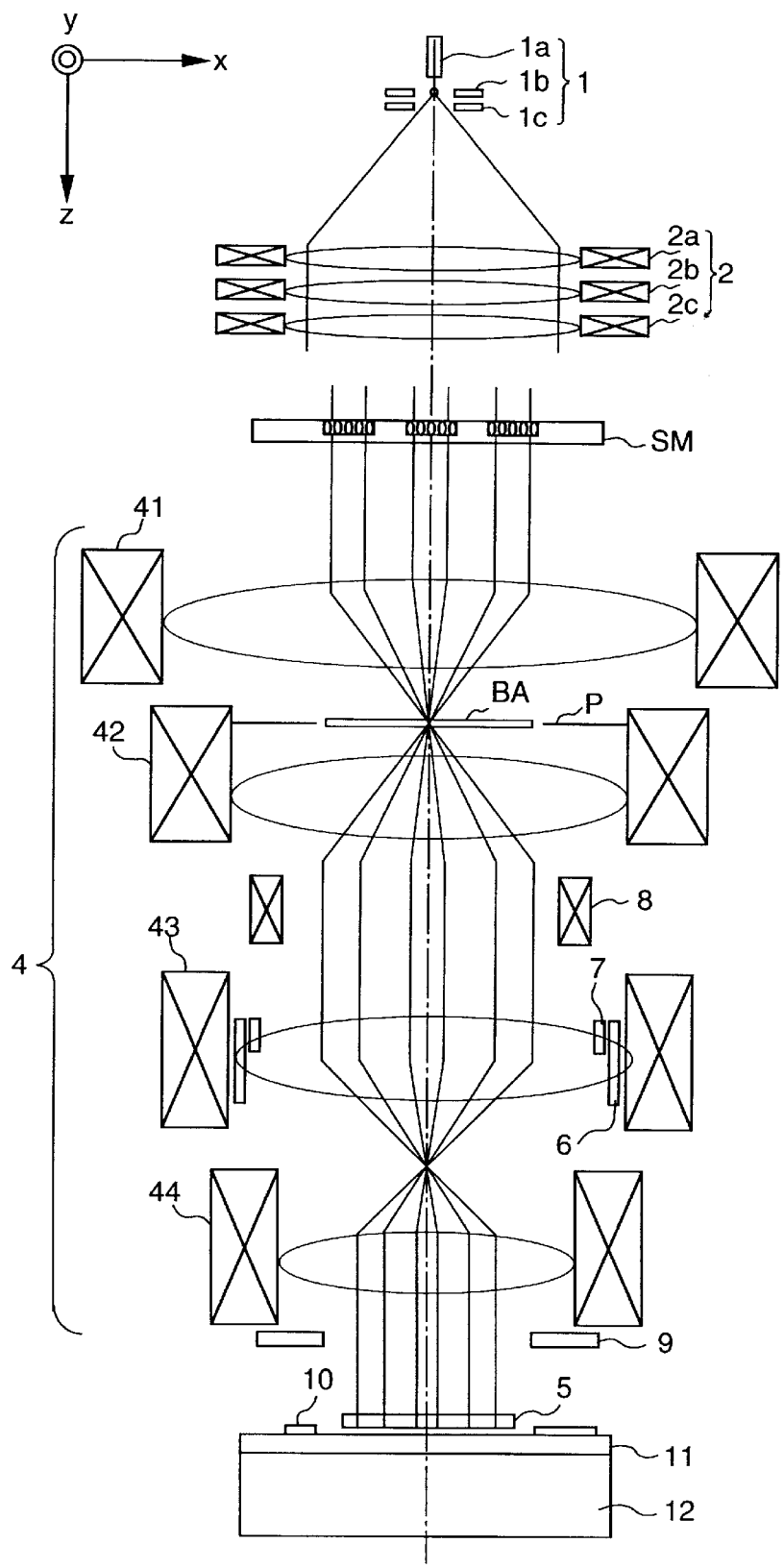
FIG. 11 is a schematic view showing a principal part of an electron beam exposure apparatus according to the first embodiment of the present invention.

FIG. 11 shows an electron beam exposure apparatus according to the second embodiment of the present invention. The same reference numerals in FIG. 11 denote the same parts as in FIG. 1, and a detailed description thereof will be omitted.

The electron beam exposure apparatus of this embodiment is a stencil mask type exposure apparatus.

More specifically, electron beams from an electron gun 1 are converted into nearly collimated electron beams by a condenser lens 2 whose front-side focal point position is located at the electron source position. The nearly collimated electron beams are irradiated onto a stencil mask SM on which a pattern is formed by portions which transmit and portions which do not transmit electron beams, i.e., which have pattern through-holes. The condenser lens 2 is made up of electron lenses 2a, 2b, and 2c. The intensity distribution of electron beams irradiated onto the stencil mask SM can be adjusted by adjusting the electron optical powers (focal lengths) of at least two of the electron lenses 2a, 2b, and 2c, adjusting the positions of at least two of the electron lenses 2a, 2b, and 2c in the optical axis direction of the condenser lens 2, or adjusting both of then. Electron beams coming from the repetitive pattern through holes formed on the stencil mask SM are projected in a reduced scale onto a wafer 5 via a reduction electron optical system 4. Furthermore, images of the repetitive pattern through-holes move on the wafer by a deflector 6, and are sequentially formed by exposure.

This embodiment uses a Faraday cup 10 that detects an electron beam via a pinhole in order to obtain the intensity distribution of electron beams irradiated onto the stencil mask SM. More specifically, before the stencil mask SM is attached to the apparatus, electron beams from the electron gun 1 are detected by the Faraday cup 10 while moving an X-Y stage 12 via a stage drive control circuit 20, thereby detecting the amount of electron beams irradiated onto a θ-Z stage 11, i.e., the current. The irradiation currents in units of positions of the Faraday cup 10 are stored. A control system 22 obtains the intensity distribution of electron beams to be actually irradiated onto the stencil mask SM on the basis of the stored detection results in units of positions of the Faraday cup 10. The control system 22 directs an intensity distribution control circuit 13 to adjust the optical powers of at least two of the electron lenses 2a, 2b, and 2c that make up the condenser lens 2, adjust the positions of at least two of the electron lenses 2a, 2b, and 2c in the optical axis direction of the irradiation optical lens system, or adjust both of them on the basis of the obtained intensity distribution, so that the amounts of electron beams irradiated onto the stencil mask SM, i.e., the currents become uniform.

Third Embodiment

In this embodiment, the elementary electron optical system array 3 of the exposure apparatus according to the first embodiment is modified. The elementary electron optical system array 3 according to this embodiment will be described below with reference to FIGS. 3 and 13.

In the elementary electron optical system array 3 according to this embodiment, a plurality of elementary electron optical systems form a group (subarray), and a plurality of subarrays are formed, as in the first embodiment. More specifically, in this embodiment, seven subarrays A to G are formed in the elementary electron optical system array 3. In each subarray, a plurality of elementary electron optical systems are two-dimensionally arranged. Twenty-five elementary electron optical systems (e.g., D(1,1) to D(5,5)) are formed in each subarray of this embodiment, and form a plurality of images, which have an interval of a pitch Pb ($\mu$m) in both the X- and Y-directions, on the wafer via the reduction electron optical system 4.

The arrangement of each elementary electron optical system that constitutes the elementary electron optical system array 3 according to this embodiment will be described below with reference to FIG. 13.

Figure 13:
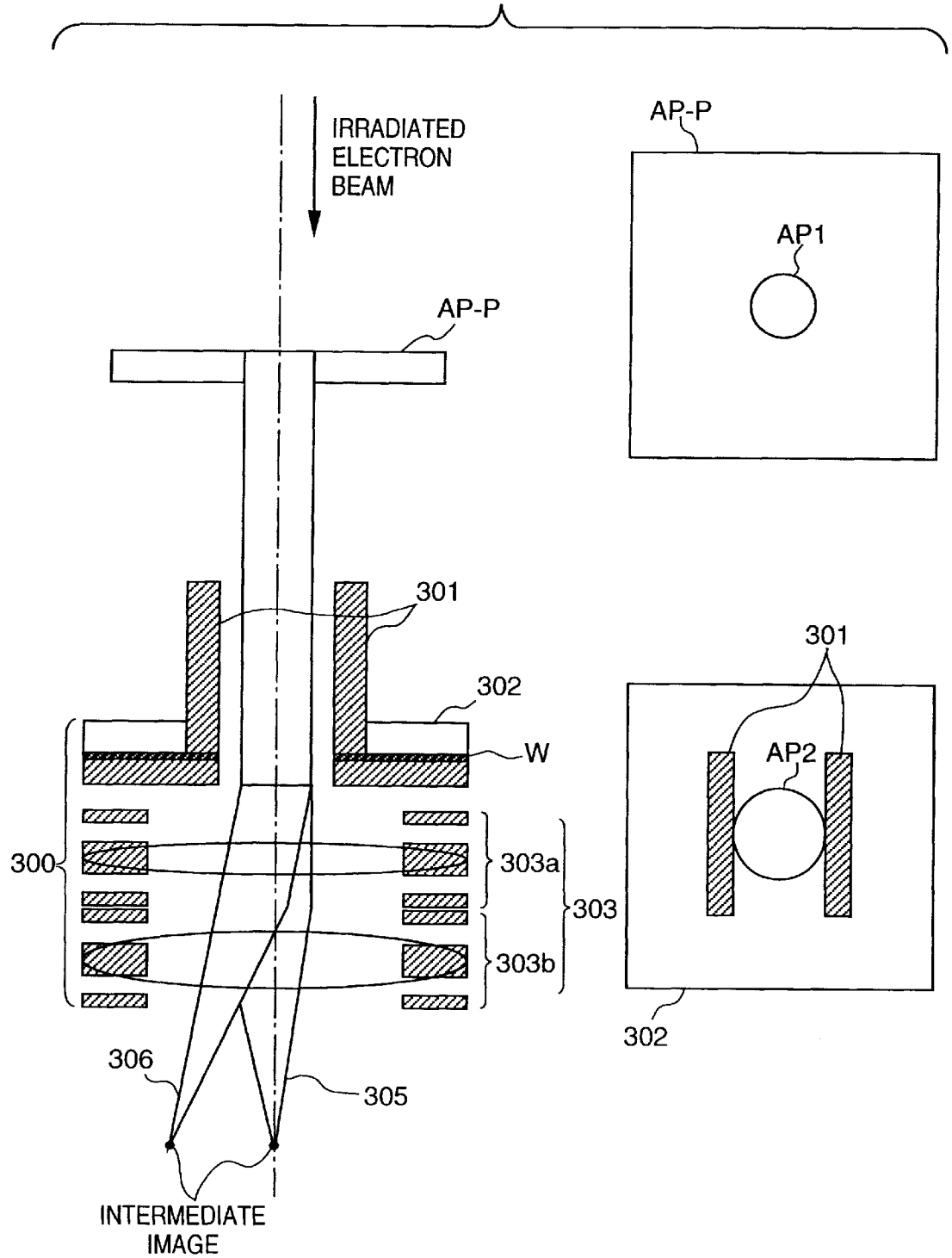
FIG. 13 is a view for explaining an elementary electron optical system according to the third embodiment.

In FIG. 13, a substrate AP-P is irradiated with an electron beam nearly collimated by the condenser lens 2. The substrate AP-P has an aperture AP1 that defines the sectional shape of the electron beam to be transmitted, and is common to other elementary electron optical systems. The aperture areas of the apertures AP1 are set to have nearly equal amounts of electron beams that are transmitted through the aperture, i.e., nearly equal currents. More specifically, the aperture area of each aperture is set to be inversely proportional to the current density per unit area by the electron beam to be transmitted. With these apertures, even when the electron beams irradiated onto the apertures AP1 have intensity variations, the currents based on the electron beams transmitted through the apertures become nearly equal to each other. In addition, since the apertures AP1 define only the divergent angle of the electron beams that form intermediate images, the intermediate images formed by the elementary electron optical systems have roughly equal sizes. Hence, the images formed on the wafer have essentially equal sizes.

Description of Operation

Figure 14:
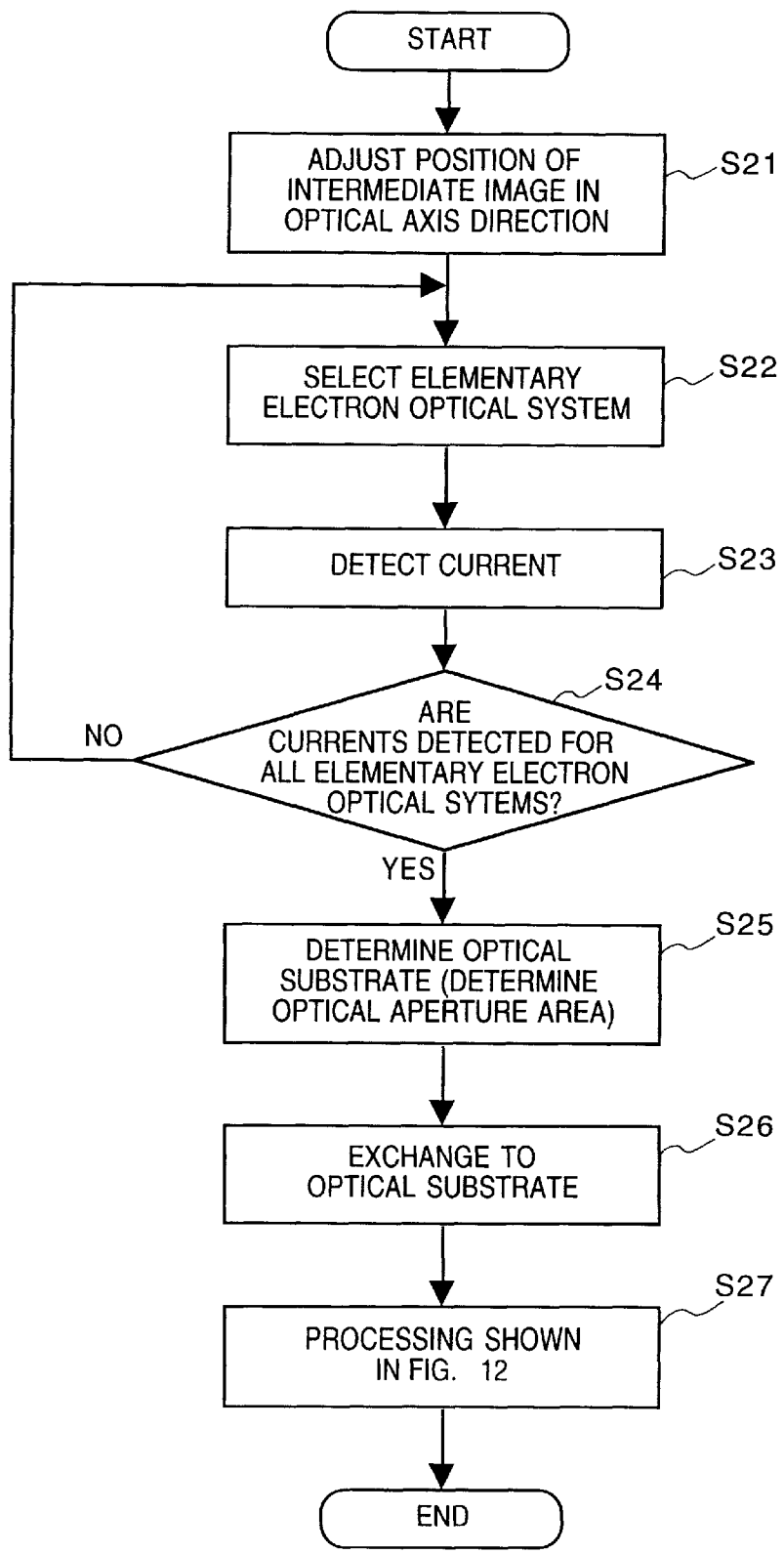
FIG. 14 is a flow chart showing the calibration procedure of the third embodiment.

The operation of the electron beam exposure apparatus of this embodiment will be described below with reference to FIGS. 6 and 14.

This exposure apparatus executes calibration before exposing a wafer. More specifically, the CPU 25 directs the control system 22 to execute calibration via the interface 24. In response to this direction, the control system 22 executes calibration shown in the flow chart in FIG. 14.

In step 21, the control system 22 adjusts the potentials of the intermediate electrodes of the elementary electron optical systems via the first focal point astigmatism control circuit 15, so as to set the positions of the intermediate images formed by the elementary electron optical systems in the elementary electron optical system array 3 at predetermined positions in the optical axis direction.

In step 22, the control system 22 selects one elementary electron optical system of the elementary electron optical system array 3, and controls the blanking control circuit 14 so that only the electron beam coming from the selected elementary electron optical system is irradiated onto the wafer side. More specifically, the control system 22 directs the blanking control circuit 14 to turn on the blanking electrodes of the elementary electron optical systems other than the selected elementary electron optical system, and to turn off the blanking electrode of the selected elementary electron optical system.

In step 23, the control system 22 directs the stage drive control circuit 20 to drive the X-Y stage 12 so that the Faraday cup 10 is located near the image formed by the electron beam coming from the selected elementary electron optical system. The control system 22 then detects the amount of electron beams coming from the selected elementary electron optical system, i.e., the current, using the Faraday cup 10. The control system 22 stores the detected current value in the memory 23 in correspondence with the selected elementary electron optical system. Note that the aperture areas of the apertures AP1 formed on the substrate AP-P of the elementary electron optical system array 3 are equal to each other or known.

In step 24, the control system 22 checks if the currents of all the elementary electron optical systems of the elementary electron optical system array 3 have been detected in step 23. If elementary electron optical systems, the currents of which are to be detected, still remain, the flow returns to step 22. In this case, in step 22, the control system 22 selects an elementary electron optical system from which a current is not detected from the elementary electron optical system array 3. In this manner, upon completion of current detection for all the elementary electron optical systems in steps 22 to 24, the flow then advances to step 25.

In step 25, the control system 22 obtains the aperture areas (optimal aperture areas) of the apertures AP1 that can make the currents based on the electron beams transmitted through the apertures AP1 of the elementary electron optical systems substantially coincide with each other, on the basis of the current values of the elementary electron optical systems stored in the memory 23. The control system 22 then determines an optimal substrate AP-P formed with apertures AP1 having optimal aperture areas, on the basis of the obtained optimal aperture areas.

In step 26, the control system 22 executes control for replacing the substrate AP-P used in the processing in steps 21 to 24 by an optimal substrate AP-P determined in step 25.

Figure 15:
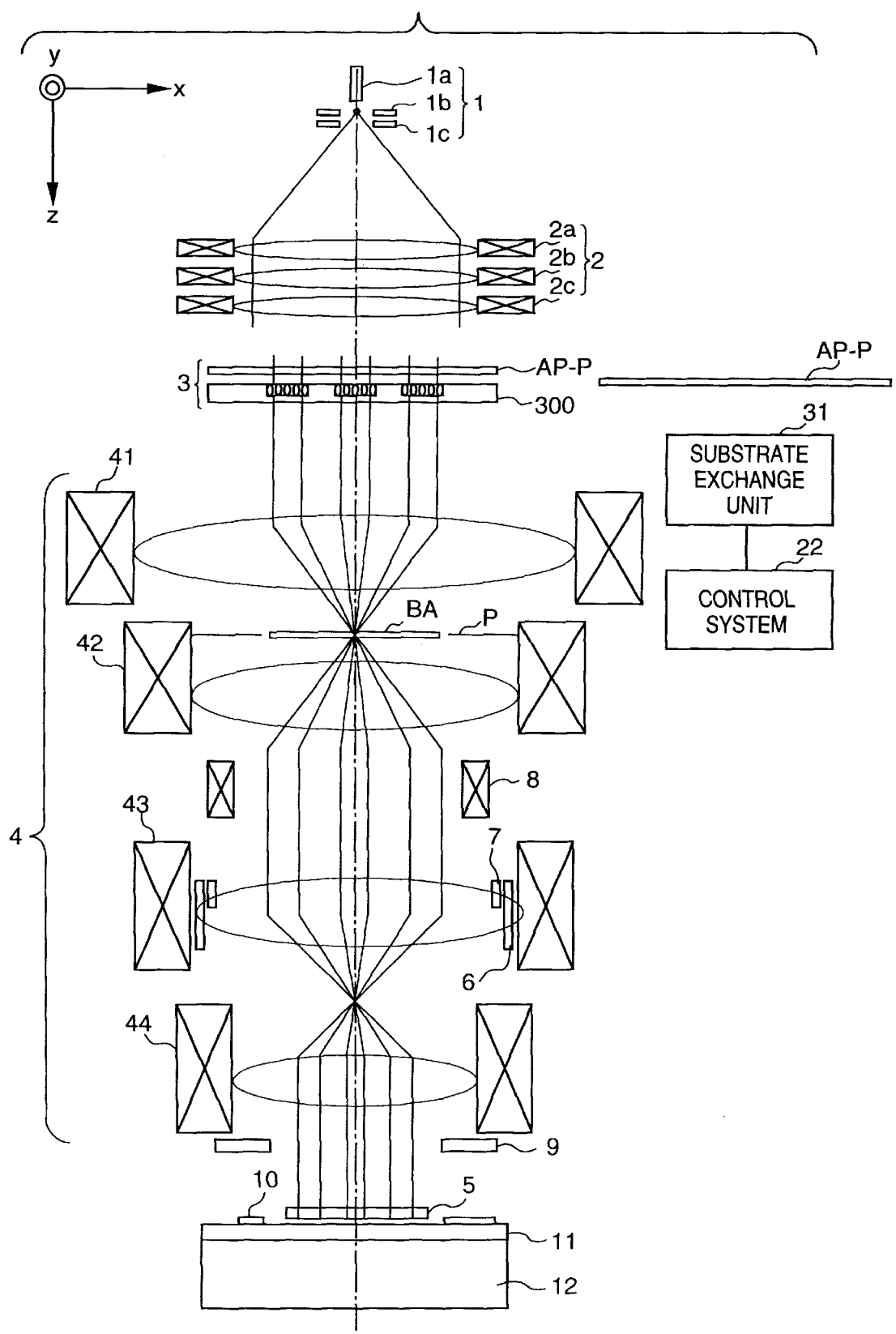
FIG. 15 is a view showing an example of an electron beam exposure apparatus having a function of automatically exchanging a substrate AP-P.

Methods of setting an optimal substrate AP-P in the exposure apparatus will be explained below. In one method, the exposure apparatus automatically exchanges a substrate AP-P. FIG. 15 shows an example of the electron beam exposure apparatus having a function of automatically exchanging a substrate AP-P. In the example shown in FIG. 15, the exposure apparatus has a plurality of substrates AP-P having different distributions of aperture areas of apertures AP1, and a substrate drive unit 31 for moving an optimal ore of the plurality of substrates AP-P to a predetermined position on a main body 300 (301 and 302) of the elementary electron optical system array 3 on the basis of the direction from the control system 22.

In another method, the operator is informed of information (e.g., an identification number) for specifying an optimal substrate AP-P determined in step 25 via a user interface 32 (including, e.g., a display), and selects and exchanges an optimal one of the plurality of substrates AP-P.

In still another method, information associated with the optimal aperture areas obtained in step 25 is output via the user interface 32, and an optimal substrate AP-P is manufactured based on this information and is attached to the exposure apparatus.

Figure 12:
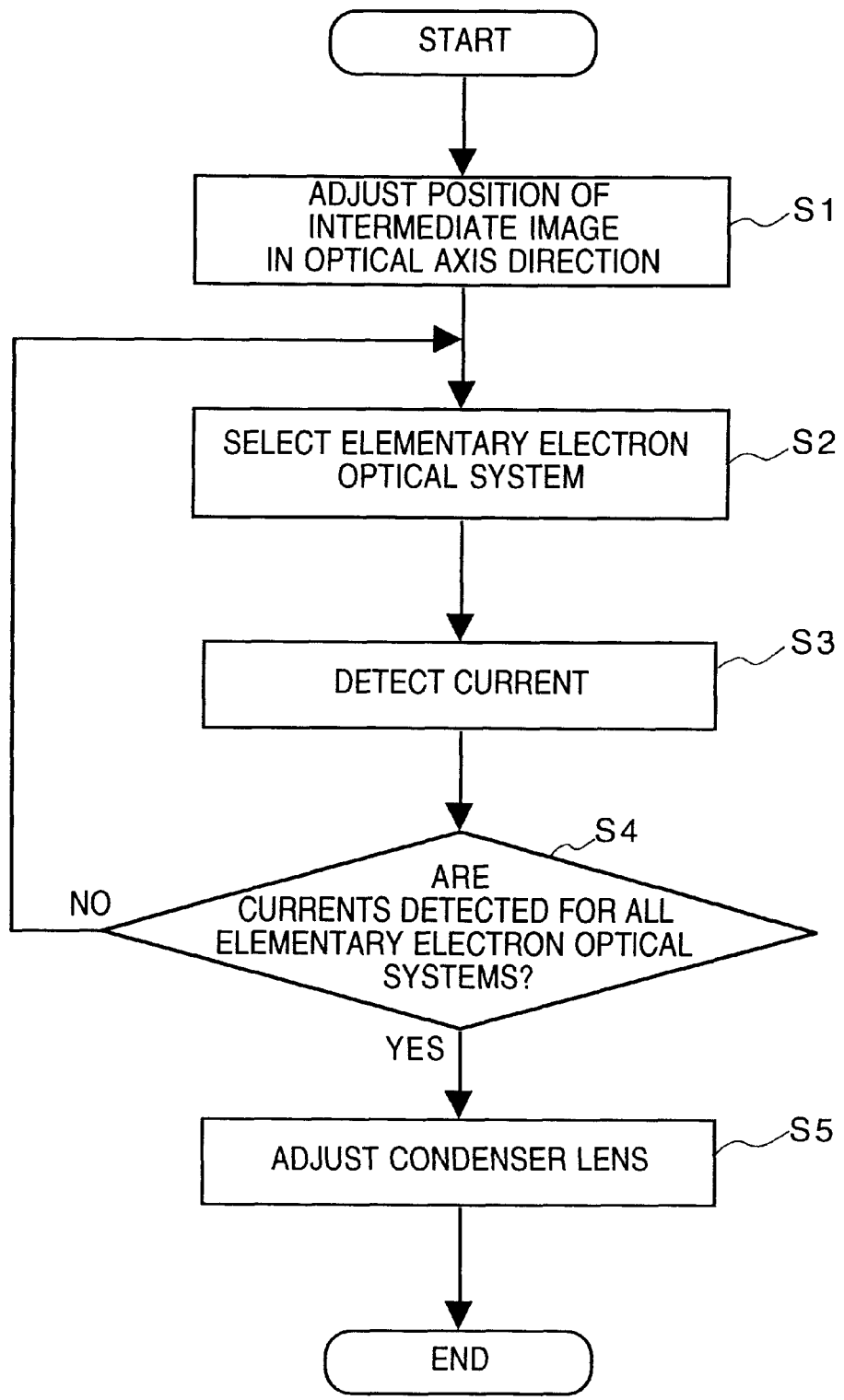
FIG. 12 is a flow chart showing the calibration procedure of the first embodiment.

Finally, the control system 22 executes the calibration of the first embodiment, i.e., the processing shown in FIG. 12, in step 27.

In this embodiment, the irradiation currents from all the elementary electron optical systems are measured. In order to shorten the measurement time, the irradiation region on the elementary electron optical system array 3 may be grouped into small regions (e.g., subarrays), and the electron beam intensity distribution may be obtained by detecting only the current based on the electron beam coming from a specific elementary electron optical system in each small region. For example, the small regions are assumed to be sub groups A to G, and only the currents based on the electron beams coming from elementary electron optical systems A(3,3), B(3,3), C(3,3), D(3,3), E(3,3), F(3,3), and G(3,3) which are located at the center of the groups are detected.

Note that the exposure procedure is the same as that in the first embodiment.

Fourth Embodiment

An embodiment of a method of manufacturing a device using the above-mentioned electron beam exposure apparatus will be explained below.

Figure 16:
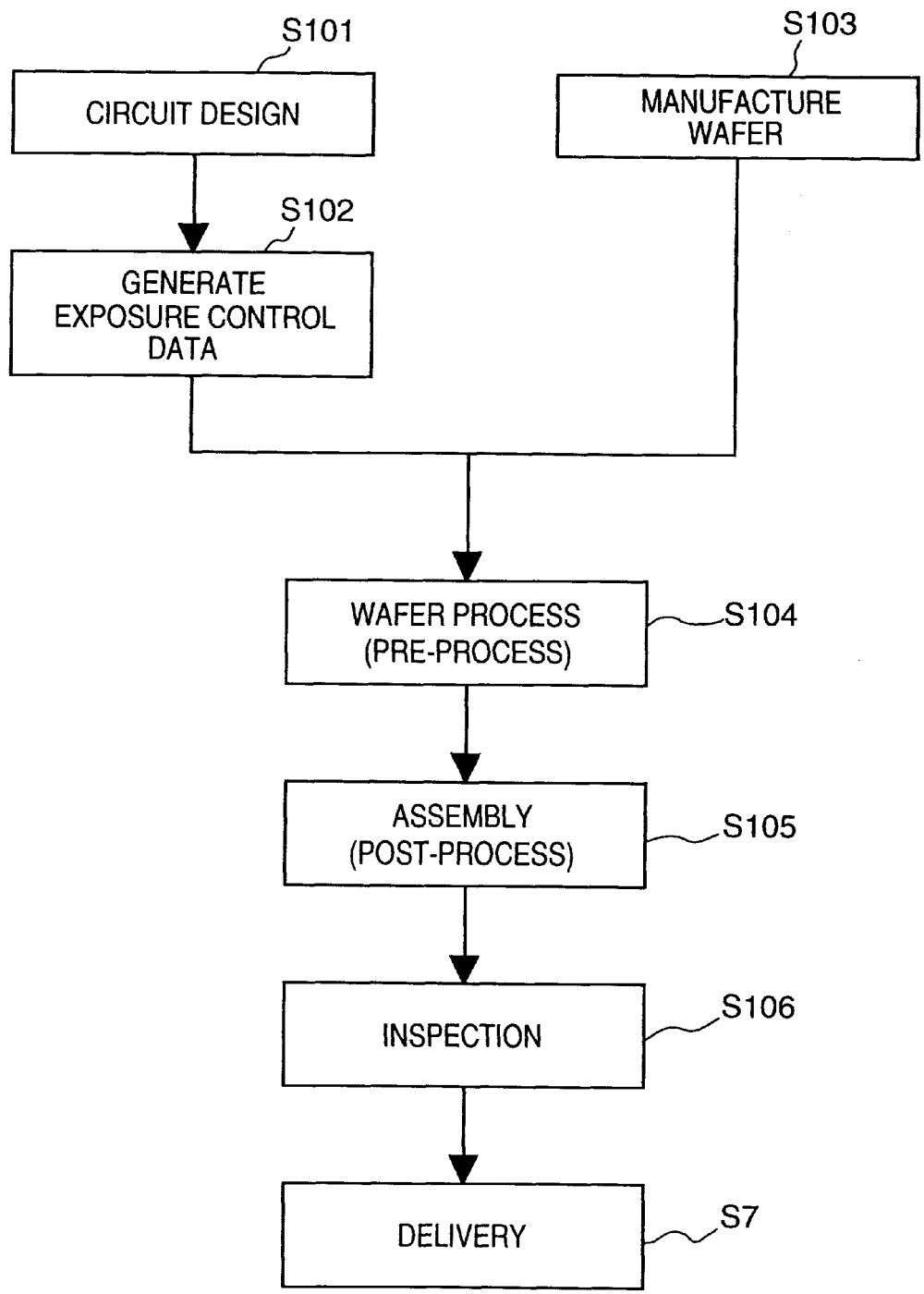
FIG. 16 is a flow chart for explaining the manufacturing flow of a microdevice.

FIG. 16 shows the flow in the manufacture of a microdevice (e.g., semiconductor chips such as ICs, LSIs, liquid crystal devices, CCDs, thin film magnetic heads, micromachines, and the like). In step 101 (circuit design), the circuit design of a semiconductor device is done. In step 102 (generate exposure control data), the exposure control data of the exposure apparatus is generated based on the designed circuit pattern. On the other hand, in step 103 (manufacture wafer), a wafer is manufactured using materials such as silicon and the like. Step 104 (wafer process) is called a pre-process, and an actual circuit is formed by lithography on the wafer using the exposure apparatus input with the prepared exposure control data, and the manufactured wafer. The next step 105 (assembly) is called a. post-process, in which semiconductor chips are assembled using the wafer obtained in step 104, and includes an assembly process (dicing, bonding), a packaging process (encapsulating chips), and the like. In step 106 (inspection), inspections such as operation tests, durability tests, and the like of semiconductor devices assembled in step 105 are conducted. Semiconductor devices are completed via these processes, and are delivered (step 107).

Figure 17:
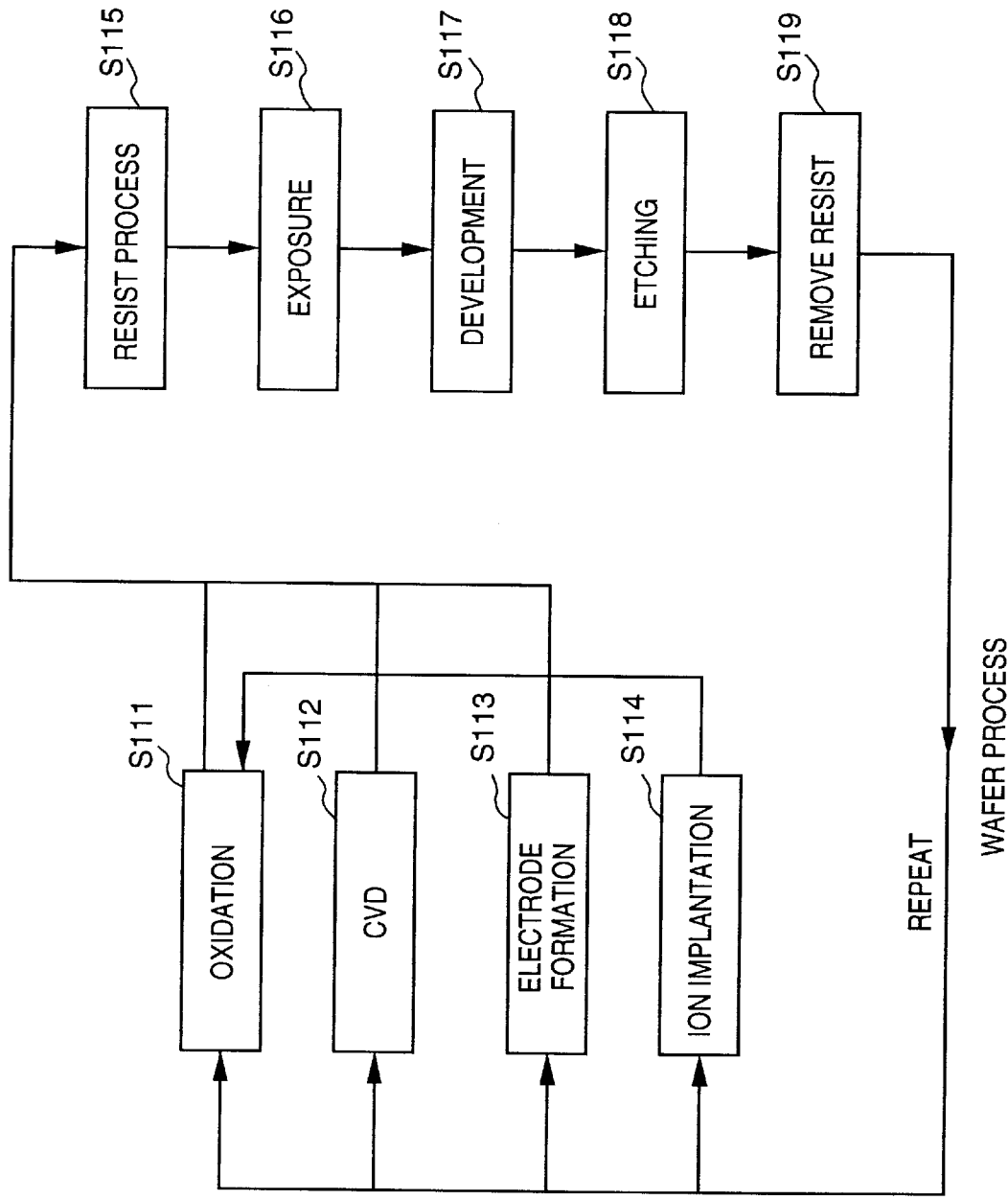
FIG. 17 is a flow chart for explaining a wafer process.

FIG. 17 shows the detailed flow of the wafer process. In step 111 (oxidation), the surface of the wafer is oxidized. In step 112 (CVD), an insulating film is formed on the wafer surface. In step 113 (electrode formation), electrodes are formed by deposition on the wafer. In step 114 (ion implantation), ions are implanted into the wafer. In step 115 (resist process), a photosensitive agent is applied on the wafer. In step 116 (exposure), the circuit pattern on the mask is printed on the wafer by exposure using the above-mentioned exposure apparatus. In step 117 (development), the exposed wafer is developed. In step 118 (etching), a portion other than the developed resist image is removed by etching. In step 119 (remove resist), the resist film which becomes unnecessary after etching is removed. By repetitively executing these steps, multiple circuit patterns are formed on the wafer.

According to the manufacturing method of this embodiment, a highly integrated semiconductor device which is not easy to manufacture by the conventional method can be manufactured at low cost.

According to an electron beam irradiation device of the present invention, electron beams can be nearly uniformly irradiated onto a broad irradiation region.

According to an electron beam exposure apparatus of the present invention, since exposure can be done using a plurality of electron beams which suffer less intensity variations, and have nearly equal beam sizes, distortions of patterns drawn on the object to be exposed can be suppressed.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus having an electron source for emitting an electron beam, and exposing an object to be exposed using the electron beam emitted by said electron source, said apparatus comprising:
   a substrate disposed between said electron source and a table for placing the object, said substrate having a plurality of apertures, each of which has an area inversely proportional to current density based on the electron beam transmitted through the aperture;
   a plurality of elementary electron optical systems for forming intermediate images of said electron source by the electron beams transmitted through the plurality of apertures of said substrate, wherein the apertures of said substrate define divergent angles of the electron beams which form the intermediate images; and
   a reduction electron optical system for projecting the plurality of intermediate images formed by said plurality of elementary electron optical systems onto the object.

2. The apparatus according to claim 1, further comprising acquisition means for acquiring information associated with an intensity distribution of the electron beam irradiated onto said substrate, and wherein the areas of the apertures of said substrate are determined on the basis of the acquired intensity distribution.

3. The apparatus according to claim 1, further comprising:
   acquisition means for acquiring information associated with an intensity distribution of the electron beam irradiated onto said substrate; and
   exchanging means for exchanging said substrate, disposed between said electron source and the table for placing the object to be exposed by a substrate having apertures with optimal areas, on the basis of the acquired intensity distribution.

4. The apparatus according to claim 1, wherein said substrate is exchangeable, and said apparatus further comprises:
   acquisition means for acquiring information associated with an intensity distribution of the electron beam irradiated onto said substrate;
   determination means for determining a substrate having apertures with optimal areas on the basis of the acquired information associated with the intensity distribution; and
   output means for outputting information for specifying the determined substrate.

5. The apparatus according to claim 1, further comprising:

an irradiation electron optical system arranged between said electron source and said substrate and including a plurality of electron lenses;
   acquisition means for acquiring information associated with an intensity distribution of the electron beam irradiated onto said substrate; and
   adjustment means for adjusting electron optical characteristics of said irradiation electron optical system on the basis of the acquired information associated with the intensity distribution.

6. The apparatus according to claim 5, wherein said adjustment means comprises means for adjusting electron optical powers of at least two of the plurality of electron lenses of said irradiation electron optical system.

7. The apparatus according to claim 5, wherein said adjustment means comprises means for adjusting positions of at least two of the plurality of electron lenses of said irradiation electron optical system in an optical axis direction of said irradiation electron optical system.

8. The apparatus according to claim 5, wherein said adjustment means adjusts the electron optical characteristics of said irradiation electron optical system to obtain a substantially constant intensity distribution of the electron beam irradiated onto said substrate.

9. The apparatus according to claim 1, further comprising correction means for correcting aberration produced when the intermediate images formed by said plurality of elementary electron optical systems are projected onto the object to be exposed via said reduction electron optical system.

10. The apparatus according to claim 1, further comprising means for controlling, in units of apertures, whether or not the electron beams transmitted through the plurality of apertures of said substrate are shielded.

11. A method of manufacturing a device using an electron beam exposure apparatus of claim 1.

12. A method of controlling an electron beam exposure apparatus, which comprises an electron source for emitting an electron beam, a substrate disposed between said electron source and a table for placing an object to be exposed, and having a plurality of apertures, a plurality of elementary electron optical systems for forming intermediate images of said electron source by the electron beams transmitted through the plurality of apertures of said substrate, and a reduction electron optical system for projecting the plurality of elementary electron optical systems onto the object, wherein the apertures of said substrate define divergent angles of the electron beams which form the intermediate images, said method comprising:
   the acquisition step of acquiring information associated with an intensity distribution of the electron beam irradiated onto said substrate; and
   the determination step of determining areas of the apertures so that each of the areas of the apertures is inversely proportional to current density based on the electron beam transmitted through the aperture.

13. The method according to claim 12, further comprising the exchanging step of exchanging said substrate by a substrate having apertures corresponding to the areas determined in the determination step.

14. The method according to claim 12, wherein said electron beam exposure apparatus further comprises an irradiation electron optical system arranged between said electron source and said substrate and including a plurality of electron lenses, and
   said method further comprises:
   the adjustment step of adjusting electron optical characteristics of said irradiation electron optical system on the basis of the information associated with the intensity distribution acquired in the acquisition step.

15. The method according to claim 14, wherein the adjustment step includes the step of adjusting electron optical powers of at least two of the plurality of electron lenses of said irradiation electron optical system.

16. The method according to claim 14, wherein the adjustment step includes the step of adjusting positions of at least two of the plurality of electron lenses of said irradiation electron optical system in an optical axis direction of said irradiation electron optical system.

17. The method according to claim 14, wherein the adjustment step includes the step of adjusting the electron optical characteristics of said irradiation electron optical system to obtain a substantially constant intensity distribution of the electron beam irradiated onto said substrate.

18. The method according to claim 12, further comprising the correction step of correcting aberration produced when the intermediate images formed by said plurality of elementary electron optical systems are projected onto the object to be exposed via said reduction electron optical system.

19. An electron beam irradiation device having an electron source for emitting an electron beam and an irradiation electron optical system arranged between said electron source and an object to be irradiated with an electron beam and including a plurality of electron lenses, said device comprising:

acquisition means for acquiring information associated with an intensity distribution of an electron beam to be irradiated onto the object;

adjustment means for adjusting electron optical powers of at least two of the plurality of electron lenses of said irradiation electron optical system to change a relationship between an exit angle of the electron beam emitted from said electron source and an incident position of the electron beam on the object while keeping a frontside focal point position of said irradiation electron optical system at a fixed position; and control means for controlling said adjustment means on the basis of the acquired information associated with the intensity distribution.

20. The device according to claim 19, wherein said control means controls said adjustment means to obtain a substantially constant intensity distribution of the electron beams irradiated onto the object.

21. An electron beam irradiation device having an electron source for emitting an electron beam and an irradiation electron optical system arranged between said electron source and an object to be irradiated with an electron beam and including a plurality of electron lenses, said device comprising:

acquisition means for acquiring information associated with an intensity distribution of an electron beam to be irradiated onto the object;

adjustment means for adjusting positions of at least two of the plurality of electron lenses of said irradiation electron optical system in an optical axis direction of said irradiation electron optical system to change a relationship between an exit angle of the electron beam emitted from said electron source and an incident position of the electron beam on the object while keeping a frontside focal point position of said irradiation electron optical system at a fixed position; and control means for controlling said adjustment means on the basis of the acquired information associated with the intensity distribution.

22. The device according to claim 21, wherein said control means controls said adjustment means to obtain a substantially constant intensity distribution of the electron beams irradiated onto the object.

23. An electron beam exposure apparatus, which has an electron source for emitting an electron beam and an irradiation electron optical system which is arranged between said electron source and a first object, including a portion for transmitting an electron beam, and includes a plurality of electron lenses, and projects the electron beam transmitted through the first object onto a second object to expose the second object via a reduction electron optical system, said apparatus comprising:

acquisition means for acquiring information associated with an intensity distribution of an electron beam to be irradiated onto the first object;

adjustment means for adjusting electron optical powers of at least two of the plurality of electron lenses of said irradiation electron optical system to change a relationship between an exit angle of the electron beam emitted from said electron source and an incident position of the electron beam on the object while keeping a frontside focal point position of said irradiation electron optical system at a fixed position; and control means for controlling said adjustment means on the basis of the acquired information associated with the intensity distribution.

24. The apparatus according to claim 23, wherein said control means controls said adjustment means to obtain a substantially constant intensity distribution of the electron beams irradiated onto the object.

25. An electron beam exposure apparatus, which has an electron source for emitting an electron beam and an irradiation electron optical system which is arranged between said electron source and a first object, including a portion for transmitting an electron beam, and includes a plurality of electron lenses, and projects the electron beam transmitted through the first object onto a second object to expose the second object via a reduction electron optical system, said apparatus comprising:

acquisition means for acquiring information associated with an intensity distribution of an electron beam to be irradiated onto the first object;

adjustment means for adjusting positions of at least two of the plurality of electron lenses of said irradiation electron optical system in an optical axis direction of said irradiation electron optical system to change a relationship between an exit angle of the electron beam emitted from said electron source and an incident position of the electron beam on the object while keeping a frontside focal point position of said irradiation electron optical system at a fixed position; and control means for controlling said adjustment means on the basis of the acquired information associated with the intensity distribution.

26. The apparatus according to claim 25, wherein said control means controls said adjustment means to obtain a substantially constant intensity distribution of the electron beams irradiated onto the object.

27. A method of controlling an electron beam irradiation device having an electron source for emitting an electron beam and an irradiation electron optical system arranged between said electron source and an object to be irradiated with an electron beam and including a plurality of electron lenses, said method comprising:

the acquisition step of acquiring information associated with an intensity distribution of an electron beam to be irradiated onto the object;

the adjustment step of adjusting electron optical powers of at least two of the plurality of electron lenses of said irradiation electron optical system to change a relationship between an exit angle of the electron beam emitted from said electron source and a incident position of the electron beam on the object while keeping a front-side focal point position of said irradiation electron optical system at a fixed position; and the control step of controlling execution of said adjustment step on the basis of the acquired information associated with the intensity distribution.

28. The method according to claim 27, wherein said control step includes the step of controlling execution of said adjustment step to obtain a substantially constant intensity distribution of the electron beams irradiated onto the object.

29. A method of controlling an electron beam irradiation device having an electron source for emitting an electron beam and an irradiation electron optical system arranged between said electron source and an object to be irradiated with an electron beam and including a plurality of electron lenses, said method comprising:

the acquisition step of acquiring information associated with an intensity distribution of an electron beam to be irradiated onto the object;

the adjustment step of adjusting positions of at least two of the plurality of electron lenses of said irradiation electron optical system in an optical axis direction of said irradiation electron optical system to change a relationship between an exit angle of the electron beam emitted from said electron source and an incident position of the electron beam on the object while keeping a front-side focal point position of said irradiation electron optical system at a fixed position; and the control step of controlling execution of said adjustment step on the basis of the acquired information associated with the intensity distribution.

30. The method according to claim 29, wherein said control step includes the step of controlling execution of said adjustment step to obtain a substantially constant intensity distribution of the electron beams irradiated onto the object.

31. A method of controlling an electron beam exposure apparatus, which has an electron source for emitting an electron beam and an irradiation electron optical system which is arranged between said electron source and a first object, including a portion for transmitting an electron beam, and includes a plurality of electron lenses, and projects the electron beam transmitted through the first object onto a second object to expose the second object via a reduction electron optical system, said method comprising:

the acquisition step of acquiring information associated with an intensity distribution of an electron beam to be irradiated onto the object;

the adjustment step of adjusting electron optical powers of at least two of the plurality of electron lenses of said irradiation electron optical system to change a relationship between an exit angle of the electron beam emitted from said electron source and an incident position of the electron beam on the object while keeping a front-side focal point position of said irradiation electron optical system at a fixed position; and the control step of controlling execution of said adjustment step on the basis of the acquired information associated with the intensity distribution.

32. The method according to claim 31, wherein said control step includes the step of controlling execution of said adjustment step to obtain a substantially constant intensity distribution of the electron beams irradiated onto the object.

33. A method of controlling an electron beam exposure apparatus, which has an electron source for emitting an electron beam and an irradiation electron optical system which is arranged between said electron source and a first object, including a portion for transmitting an electron beam, and includes a plurality of electron lenses, and projects the electron beam transmitted through the first object onto a second object to expose the second object via a reduction electron optical system, said method comprising:

the acquisition step of acquiring information associated with an intensity distribution of an electron beam to be irradiated onto the first object;

the adjustment step of adjusting positions of at least two of the plurality of electron lenses of said irradiation electron optical system to change a relationship between an exit angle of the electron beam emitted from said electron source and an incident position of the electron beam on the object while keeping a front-side focal point position of said irradiation electron optical system at a fixed position; and the control step of controlling execution of said adjustment step on the basis of the acquired information associated with the intensity distribution.

34. The method according to claim 33, wherein said control step includes the step of controlling execution of said adjustment step to obtain a substantially constant intensity distribution of the electron beams irradiated onto the object.

* * * * *

UNITED STATES PATENT AND TRADEMARK OFFICE
CERTIFICATE OF CORRECTION

PATENT NO. : 5,981,954

DATED : November 9, 1999

INVENTOR(S): MASATO MURAKI                        Page 1 of 2

It is certified that error appears in the above-identified patent and that said Letters Patent is hereby corrected as shown below:

<u>COLUMN 2</u>:
Line 49, "the" should be deleted and "said" should be deleted.

<u>COLUMN 8</u>:
Line 20, "point.astigmatism" should read --point astigmatism--.

<u>COLUMN 11</u>:
Line 52, "then." should read --them.--; and
Line 53, "through holes" should read --through-holes--.

<u>COLUMN 13</u>:
Line 61, "ore" should read --one--.

<u>COLUMN 14</u>:
Line 43, "a." should read --a--.

UNITED STATES PATENT AND TRADEMARK OFFICE
CERTIFICATE OF CORRECTION

PATENT NO. : 5,981,954

DATED : November 9, 1999

INVENTOR(S): MASATO MURAKI                                    Page 2 of 2

It is certified that error appears in the above-identified patent and that said Letters Patent is hereby corrected as shown below:

COLUMN 19:
Line 5, "a" should read --an--.

Signed and Sealed this

Twenty-first Day of November, 2000

Attest:

Q. TODD DICKINSON

Attesting Officer        Director of Patents and Trademarks